United States Patent
Sachs et al.

(10) Patent No.: US 10,072,351 B2
(45) Date of Patent: Sep. 11, 2018

(54) METHODS AND APPARATI FOR MAKING THIN SEMI-CONDUCTOR WAFERS WITH LOCALLY CONTROLLED REGIONS THAT ARE RELATIVELY THICKER THAN OTHER REGIONS AND SUCH WAFERS

(71) Applicant: 1366 TECHNOLOGIES, INC., Bedford, MA (US)

(72) Inventors: Emanuel M. Sachs, Newton, MA (US); Ralf Jonczyk, Concord, MA (US); Adam L. Lorenz, Arlington, MA (US); Richard L. Wallace, Acton, MA (US); G. D. Stephen Hudelson, Lexington, MA (US)

(73) Assignee: 1366 Technologies, Inc., Bedford, MA (US)

( * ) Notice: Subject to any disclaimer, the term of this patent is extended or adjusted under 35 U.S.C. 154(b) by 0 days.

(21) Appl. No.: 15/306,787

(22) PCT Filed: Apr. 17, 2015

(86) PCT No.: PCT/US2015/026389
§ 371 (c)(1),
(2) Date: Oct. 26, 2016

(87) PCT Pub. No.: WO2015/167826
PCT Pub. Date: Nov. 5, 2015

(65) Prior Publication Data
US 2017/0051429 A1    Feb. 23, 2017

Related U.S. Application Data

(60) Provisional application No. 62/011,866, filed on Jun. 13, 2014, provisional application No. 61/986,388, filed on Apr. 30, 2014.

(51) Int. Cl.
*H01L 29/06* (2006.01)
*C30B 11/02* (2006.01)
(Continued)

(52) U.S. Cl.
CPC .............. *C30B 11/02* (2013.01); *C30B 29/06* (2013.01); *H01L 29/0657* (2013.01);
(Continued)

(58) Field of Classification Search
CPC ............ H01L 31/0682; H01L 33/0079; H01L 29/0657; H01L 31/035281; H01L 31/028;
(Continued)

(56) References Cited

U.S. PATENT DOCUMENTS 7,018,929 B2 * 3/2006 Chen ................. H01J 37/32743
257/E21.218
7,456,084 B2    11/2008 Jonczyk et al.
(Continued)

OTHER PUBLICATIONS

International Preliminary Report on Patentability, dated Nov. 10, 2016 for PCT/US2015/026389, to which the present application claims priority.
(Continued)

*Primary Examiner* — Jasmine Clark
(74) *Attorney, Agent, or Firm* — Steven J. Weissburg

(57) ABSTRACT

Semi-conductor wafers with thin and thicker regions at controlled locations may be for Photovoltaics. The interior may be less than 180 microns or thinner, to 50 microns, with a thicker portion, at 180-250 microns. Thin wafers have higher efficiency. A thicker perimeter provides handling strength. Thicker stripes, landings and islands are for metallization coupling. Wafers may be made directly from a melt upon a template with regions of different heat extraction propensity arranged to correspond to locations of relative thicknesses. Interstitial oxygen is less than $6 \times 10^{17}$
(Continued)

atoms/cc, preferably less than $2 \times 10^{17}$, total oxygen less than $8.75 \times 10^{17}$ atoms/cc, preferably less than $5.25 \times 10^{17}$. Thicker regions form adjacent template regions having relatively higher heat extraction propensity; thinner regions adjacent regions with lesser extraction propensity. Thicker template regions have higher extraction propensity. Functional materials upon the template also have differing extraction propensities.

21 Claims, 19 Drawing Sheets

(51) Int. Cl.
    *C30B 29/06*     (2006.01)
    *H01L 31/0224*     (2006.01)
    *H01L 31/028*     (2006.01)
    *H01L 31/0352*     (2006.01)
    *H01L 31/068*     (2012.01)
    *H01L 31/18*     (2006.01)

(52) U.S. Cl.
    CPC .... *H01L 31/028* (2013.01); *H01L 31/022441* (2013.01); *H01L 31/035281* (2013.01); *H01L 31/0682* (2013.01); *H01L 31/1804* (2013.01); *Y02E 10/547* (2013.01); *Y02P 70/521* (2015.11)

(58) Field of Classification Search
    CPC ......... H01L 31/022441; H01L 31/1804; H01L 31/02021; H01L 31/03529; Y02P 70/521; C30B 11/02; C30B 29/06; Y02E 10/547
    See application file for complete search history.

(56) References Cited

U.S. PATENT DOCUMENTS

| | | | |
|---|---|---|---|
| 2003/0022400 A1* | 1/2003 | Nomoto | B24B 37/013 438/14 |
| 2007/0034251 A1 | 2/2007 | Jonczyk et al. | |
| 2007/0166146 A1* | 7/2007 | Sekiya | H01L 21/02021 438/459 |
| 2007/0231929 A1* | 10/2007 | Kajiyama | H01L 21/67092 438/6 |
| 2008/0314443 A1 | 12/2008 | Bonner et al. | |
| 2010/0140708 A1* | 6/2010 | Hill | G02B 6/136 257/348 |
| 2013/0036967 A1 | 2/2013 | Sachs et al. | |
| 2014/0008768 A1* | 1/2014 | Sato | H01L 21/02024 257/620 |

OTHER PUBLICATIONS

International Search Report and the Written Opinion of the International Search Authority, dated Jul. 8, 2015, 2016 for PCT/US2015/026389, to which the present application claims priority.

First Office Action from the State Intellectual Property Office of the People's Republic of China dated Sep. 4, 2017, for Chinese Patent Application No. 201580021644.1, which claims priority to PCT/US2015/026389, to which the present application claims priority.

\* cited by examiner

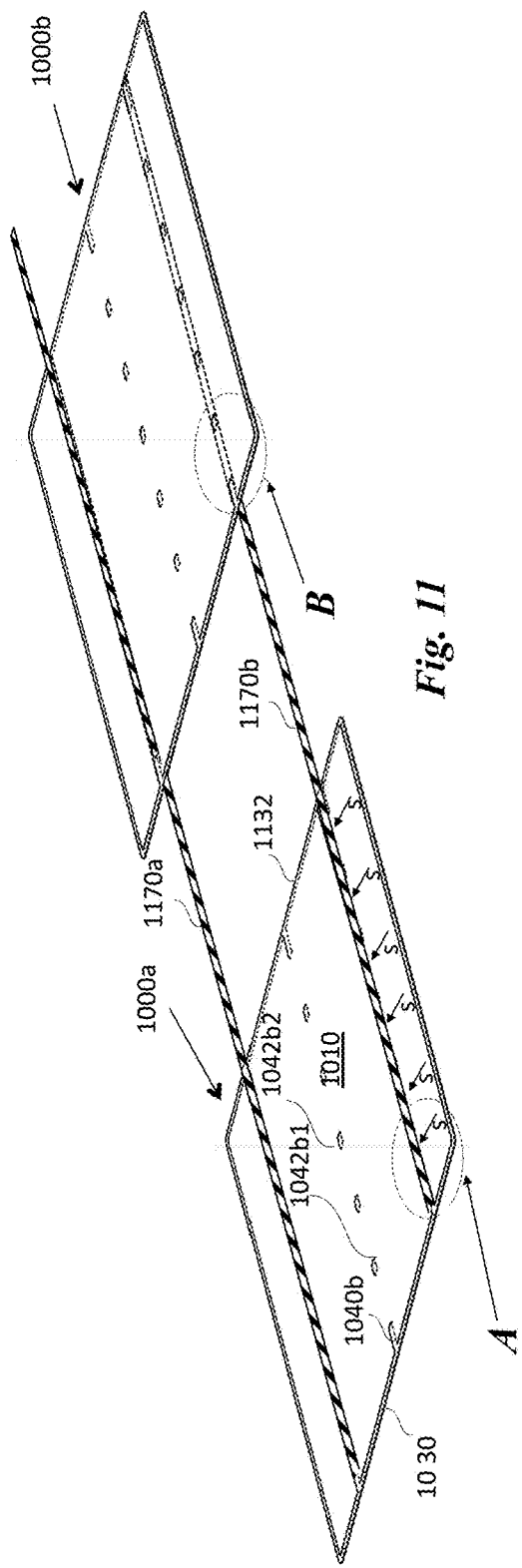
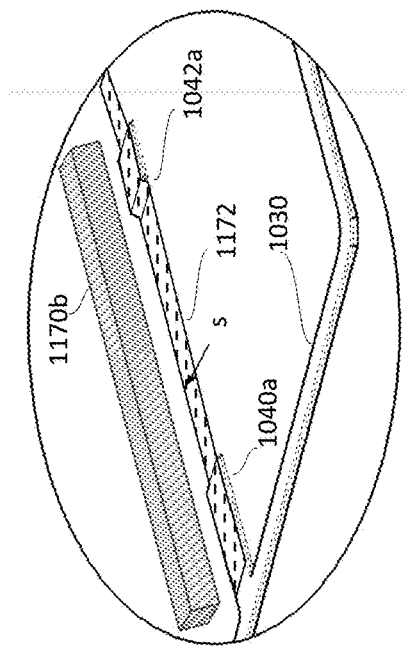
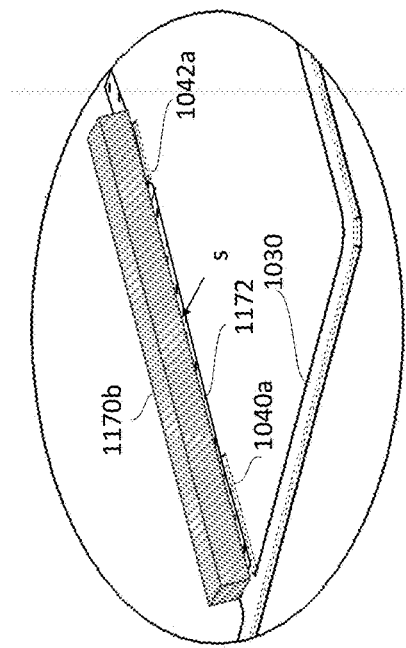
Fig. 11
Fig. 11A
Fig. 11B

METHODS AND APPARATI FOR MAKING THIN SEMI-CONDUCTOR WAFERS WITH LOCALLY CONTROLLED REGIONS THAT ARE RELATIVELY THICKER THAN OTHER REGIONS AND SUCH WAFERS

RELATED DOCUMENTS

This is the 35 U.S.C. § 371 U.S. National Phase of Patent Cooperation Treaty application No. PCT/US2015/026389, entitled, METHODS AND APPARATI FOR MAKING THIN SEMI-CONDUCTOR WAFERS WITH LOCALLY CONTROLLED REGIONS THAT ARE RELATIVELY THICKER THAN OTHER REGIONS AND SUCH WAFERS, International filing date of Apr. 17, 2015, to which the benefit of priority is hereby claimed. The PCT application claims the benefit of and priority to U.S. Provisional application No. 61/986,388, filed on Apr. 30, 2014, entitled METHODS AND APPARATI FOR THE AUTOMATED MANUFACTURE OF KERFLESS WAFERS, and also claims the benefit of and priority to U.S. Provisional application No. 62/011,866, filed on Jun. 13, 2014, entitled TECHNIQUES, METHODS AND APPARATI FOR THE AUTOMATED MANUFACTURE OF KERFLESS WAFERS. Both of the above mentioned provisional applications are incorporated herein fully by reference.

BACKGROUND

Typically, silicon wafers for solar cells are 156 mm×156 mm and 180 to 200 microns thick. Because the highly refined silicon used to make these wafers is quite expensive, it would be advantageous to use thinner wafers, in order to reduce materials costs. Further, with an appropriate cell construction, the relatively thinner silicon wafers have relatively higher efficiency than thicker silicon cells. Cell constructions that would show higher efficiency using thinner wafers are those that result in low surface recombination and good light trapping. The PERC cell structure is currently the most widely adopted such cell structure. (PERC stands for Passivated Emitter Rear Contact.) The reason for this higher efficiency is thought to be lower volume recombination due to shorter distance in a thinner body than a thicker one, to the collecting pn-junction. The amount of increase in cell efficiency resulting from thinner thickness depends on the cell construction or architecture, and also on the electronic quality of the wafer. Generally, greater increases are associated with lower wafer electronic quality. Thus, there is a strong motivation to use thinner wafers, both for reduced wafer cost and for increased cell efficiency. A further advantage of thinner wafers is that the minority carrier injection level is higher per unit volume because the same number of photons are absorbed in less material for a higher injection level, and multi-crystalline silicon material has higher bulk minority carrier lifetime at higher injection levels.

Silicon wafers for photovoltaics (PV) are typically made by growing or casting an ingot and then by slicing the ingot into wafers, typically by wire sawing. Wire sawing can be used to produce wafers thinner than the standard 180-200 micron thickness. However, such thinner wafers have been found to break during cell fabrication, electrical interconnection and encapsulation into a module. For these reasons, after trying thinner wafers (as thin as 120 microns), the industry has returned to the previous standard of 180-200 microns. For typical cell structures including PERC using multi-crystalline silicon material, making wafers thinner than 80 microns does not provide any further appreciable efficiency gain.

The increased breakage of thinner wafers has several origins. During cell fabrication, wafers often break by propagation of a defect from an edge of the wafer. Edge defects include cracks and thin spots. Further, during handling, new cracks and defects are created at the edges, because they are the locations of contact with other pieces of equipment during the manufacturing process. Cracks starting from an edge are a problem during cell making and module fabrication. In general, it has been found that with presently used machinery and methods, PV wafers that are thinner than 150 microns are damaged with unacceptable frequency to be practical.

In addition, bus wires and other electrical connections must be attached to the top and bottom electrodes of cells to interconnect them. These wires can be fairly substantial in cross section to be able to carry the large currents generated by a solar cell. For example, a typical copper bus wire in a 3-buswire cell can be 1.6 mm wide and 0.15 mm thick. These wires are attached to the metallization on a cell by soldering or using conductive adhesive. The attachment itself creates stress between the wire and the metallization, especially in the case of soldering. The coefficients of thermal expansion of the wire and the silicon cell are different (the wire's being higher than the silicon's) and therefore changes in temperature lead to more stresses between wire and cell. The attachment and thermal expansion stresses can cause delamination of the wire and/or metallization from the cell, especially near the edges of a cell. Further, the bus wires must be bent down from the top surface of the cell to wrap under to the back surface of the adjacent cell. This bent wire adds to delamination stresses at the metallization near the edge of the cell. Further, if improperly bent, the wire can actually touch the edge of the cell, thereby causing or propagating edge cracks.

According to another method of fabrication, a semiconductor wafer is formed from a semiconductor melt, generally using techniques disclosed in U.S. Pat. No. 8,293,009, issued on Oct. 23, 2012, entitled METHODS FOR EFFICIENTLY MAKING THIN SEMICONDUCTOR BODIES FROM MOLTEN MATERIAL FOR SOLAR CELLS AND THE LIKE, by Sachs, et al., which is fully incorporated herein by reference). The technology disclosed in this patent is referred to herein generally as Direct Wafer® (DW) wafer forming technology. According to this technology, a thin semi-conductor body, such as a wafer, is formed from a melt of semi-conductor material, rather than being sawn from an ingot, or grown between strings, or some other method.

Briefly, according to the Direct Wafer (DW) wafer forming technology, a pressure differential is applied across a porous mold sheet and a semiconductor (e.g. silicon) wafer is formed thereon. Relaxation of the pressure differential allows release of the wafer. The mold sheet may be cooler than the melt. Heat is extracted through the thickness of the forming wafer. The liquid and solid interface is substantially parallel to the mold sheet. The temperature of the solidifying body is substantially uniform across its width, resulting in low stresses and dislocation density and higher crystallographic quality. The porous mold sheet must be sufficiently permeable to allow flow of gas through it. It must not be so permeable as to allow the intrusion of molten material into the openings of the porosities during the time the pressure differential is provided. Otherwise, the porosities would become clogged and the pressure differential could not be maintained. The melt can be introduced to the sheet by: full area contact with the top of a melt; traversing a partial area contact of melt with the mold sheet, whether horizontal or vertical, or in between; and by dipping the mold into a melt. The grain size can be controlled by many means. The pressure differential, sometimes referred to in the Direct Wafer technology patent and herein as the differential pressure regime, may be established by maintaining the melt surface at atmospheric pressure, and maintaining the back surface of the mold sheet at less than atmospheric pressure. In another embodiment differential pressure between the faces of the mold sheet is generated by venting the back face of the mold sheet directly to atmosphere, while maintaining the atmosphere on the forming face of the mold sheet at a pressure substantially higher than local atmospheric pressure. An advantage of this embodiment is that a vacuum pump is not required. The mold face and the melt surface contact each other for a period of time that may be referred to as a contact duration. During at least a part of the contact duration, the differential pressure regime is provided. It is beneficial to form the wafer from the melt, and it is considered an invention of the Direct Wafer technology patent, and also one of the inventions disclosed herein, to create a solidified body within the melt, and to form such a body, for instance a wafer, on the mold sheet (or, in the case of inventions disclosed herein, a template). It need not be released from the mold sheet (or template) to constitute a valuable article of manufacture. But also, the formed wafer can be removed from the mold sheet in a variety of ways. In some cases, the differential pressure regime can be removed, i.e., if a vacuum is used, it can be turned off, and the wafer falls off. Or, the differential pressure regime can be reduced—i.e., the degree of vacuum can be reduced, or, the difference in pressure can be reduced. Further, mechanical means, such as stripping pins, a stripping frame, or other tools that mechanically contact the wafer and press it away from the mold-sheet, can be used.

Regarding the porosity of the mold sheet, in one embodiment, the porosity of the surface touching the at first molten and later solidified, semiconductor material, must be small enough in scale so as to make it difficult for the molten semiconductor to enter into the porosities. Typically, the pore size of interest may range from 0.1 to 10.0 microns. The porosities are interconnected so that gas passing through the porous medium of the mold typically flows in complex patterns, thus accommodating local blockages by finding circuitous paths around any blockages.

The very outer surface of the porous body, which forms the surface that faces and contacts the surface of the molten material, may be slightly non-planar (on a microscopic or slightly larger scale), thus allowing the molten semiconductor to touch the mold surface only at particular, although numerous and densely packed locations. With this structure, gas can flow a bit laterally between the molten material and the surface of the porous mold. This permits the suction that is provided by the differential pressure regime to apply force upon the wafer surface over a very large percentage of its surface area, approximately 100%. This is in contrast to a case where a smaller number of larger holes could be provided, through which holes the differential pressure could be provided, to establish an equivalent pressure differential. In the latter case, the locus of the pressure differential is confined to the relatively small surface area of the relatively small number of large holes In contrast, in the former case, of a truly porous body, because the gas can flow laterally, the pressure differential is actually present in a much more distributed nature over the entire surface area of the mold and attached wafer. The word porous is used herein to describe the former case, and not the latter.

Wafers made by a Direct Wafer (DW) wafer forming technology method have certain advantages over wire-sawn wafers, for instance there is much less waste of raw silicon, because there is no material ground to powder and thus lost to sawing. Furthermore, the method by which they are made, principally by contacting a mold to a surface of molten material, lends itself to specific control of certain aspects of wafer fabrication, as discussed below. However, like wire-sawn wafers, wafers made by the Direct Wafer patent technology method of the standard thickness are also less efficient than would be thinner wafers made by the same technique, for the same reasons of efficiency discussed above. Further relatively thinner wafers made by Direct Wafer patent technology are more fragile or otherwise not as strong as standard thickness, relatively thicker wafers made by the same Direct Wafer patent technology. Furthermore, relatively thinner wafers made by Direct Wafer patent technology methods would use less raw semi-conductor material than would relatively thicker wafers made using Direct Wafer patent technology.

Thus, it would be desirable to reduce the costs of PV modules, and, in particular, to reduce the volume and thus the cost of silicon required for each wafer, manufactured by whatever method, without sacrificing strength, durability, or performance. It would also be desirable to increase the strength of fabricated wafers, without unduly increasing their cost, weight, size, rigidity, or other properties. It would also be desirable to provide wafers having a relatively higher efficiency than wafers of the standard 180-200 micron thickness. It would also be desirable to enable making electrical connections to generally thin semi-conductor wafers, to be able to connect them to each other and to other components.

Researchers have experimented with powder based technologies and settering, to create wafers that have some regions that are thinner than others, for instance with a thinner interior and a thicker perimeter. See for instance U.S. Pat. No. 7,456,084 B2, in the names of Jonczyk et al., METHOD OF USING A SETTER HAVING A RECESS IN MANUFACTURING A NET-SHAPE SEMICONDUCTOR WAFER (the '084 patent). In this settering work, powdered silicon is provided in a mold (referred to as a setter in the '084 patent) of the desired shape, and it is heated, causing the powder material to melt and coalesce into a solid body of multi-crystalline silicon. A major difficulty with the technology disclosed in the '084 patent, and with any powder technology, is that the interstitial oxygen content is unacceptably high for a semi-conductor, particularly for photovoltaic use. This is because, without conducting extraordinary steps, native oxide on the powder particles results in high interstitial oxygen levels in the wafers. Relatively smaller particles result in relatively more interstitial oxygen in the finished product. To achieve relatively thinner wafers, relatively smaller particles must be used. Thus, to achieve relatively thinner wafers, relatively more interstitial oxygen will be present in the wafers, if made from particles.

For instance, the '084 patent discusses wafers having a range of relatively large thickness, between 300 and 1000 microns, made from powder. Based on theoretical analysis conducted by the present inventors, it is believed that this would have resulted in wafers having interstitial oxygen content of between $6 \times 10^{17}$ and $2 \times 10^{18}$ atoms/cc, as measured by Fourier Transform Infrared Spectroscopy (FTIR), method ASTM-F1188. As a theoretical example, assuming spherical 150 micron diameter powder with a 1 nm thick native oxide shell a total oxygen concentration of $1 \times 10^{18}$ atoms/cc would be present. In practice, silicon powder is non-spherical with aspect ratio >2:1, so they will contain greater surface area to volume ratio the theoretical spheres used in the estimate above, and even higher oxygen concentration. To achieve thinner wafers, having thickness of less than 300 microns, smaller particles would be required, resulting in higher oxygen concentration. It should be emphasized that, although the '084 patent mentions theoretically a wafer as thin as 100 microns, the '084 patent states that more typical would be 350-900 microns. Most importantly, it does not have any formal examples, nor does it discuss having made any actual wafers according to the processes disclosed therein. The only wafers that it discusses as having thicker and thinner regions are 900 microns thick at their thinner portions, and there is no explicit discussion of such wafers having been made.

In general, it is believed that particles to be used to fabricate thin wafers should be no larger than ⅓ the finished thickness of the wafer. For instance, to make a wafer thinner than 150 microns, the powder particles should be smaller than 50 microns. Particles of such small dimensions would have a very large surface area relative to the volume of material provided. This relatively large surface area is accompanied necessarily by a relatively large amount of interstitial oxygen, through native oxide, hydrocarbons and metals. Too much interstitial oxygen would likely lead, not only to poor performance, but in the extreme, may prevent the powder from properly melting and crystallizing. Oxygen on such small powder would also form massive amounts of SiO, which could condense anywhere in the furnace where the temperature is even a little lower than the melt temperature.

It is acknowledged in the '084 patent, at col. 5, lines 1-10, that the presence of silicon oxide in the semi-conductor material (or other oxides for other semi-conductors) is an undesirable contamination, and that it is relatively worse for relatively smaller particle sizes. Thus, the lower limit of particle size, which limits the thinness that can be achieved in the final wafer, is limited by the potential for interstitial oxide contamination. To have used 50 micron particle size powder, as would be required to fabricate 150 micron or less thick wafers, would result in nearly four times as much oxygen on the smaller particles of powder as would have been present on particles used to make 300-600 micron wafers. Thus, to have used 50 micron particles (to achieve a 150 micron thick wafer) it would be expected to have resulted in a wafer having at least $3 \times 10^{18}$ atoms/cc interstitial oxygen, and most likely more.

It would be desirable to have interstitial oxygen levels at any value below $6 \times 10^{17}$ atoms/cc and preferably less than $2 \times 10^{17}$ atoms/cc. Achieving each degree of a lesser amount of interstitial oxygen (e.g., $5 \times 10^{17}$ atoms/cc, $4 \times 10^{17}$ atoms/cc, etc., just to pick two break points, provides relatively more advantage than higher amounts.

It is theoretically possible through known heat-treating, such as a gettering, to precipitate interstitial oxygen above approximately $2 \times 10^{17}$ atoms/cc. Thus, the interstitial oxygen reduces to possibly approximately that value, but the total oxygen in the crystal remains relatively and detrimentally high, at at least $8.75 \times 10^{17}$ atoms/cc (=10 ppmw), as measured by an IGA (Interstitial Gas Analysis) method, such as is provided by LECO corporation of St. Joseph, Mich. However, it would be desirable to have total oxygen levels at less than $8.74 \times 10^{17}$ atoms/cc. Any value below this value, and preferably bless than $5.25 \times 10^{17}$ atoms/cc (=6 ppmw) would provide advantages. Achieving each degree of a lesser amount of total oxygen (e.g., $7 \times 10^{17}$ atoms/cc, $6 \times 10^{17}$ atoms/cc, just to pick two break points, provides relatively more advantage.

Another problem related to powder based wafer forming, particularly with semi-conductors such as silicon, is due to silicon's very high surface tension. A thin wafer cannot be made from powder and setter technology if all of the silicon is melted in any location at the same time. A certain minimum amount of un-melted silicon is required to break surface tension. Otherwise, balls of silicon form, rather than flattened thin structures. The wafer making process disclosed in the '084 patent involved melting the silicon powder partially, and then crystallizing it on one side, before melting the remaining un-melted powder from the other side and continuing growth epitaxially on the previously grown silicon. See generally col. 7, lines 55-col. 8, line 64, and FIG. 1 and FIG. 2. The text describes a top-down heating and grain growth process. FIG. 2 of the '084 patent shows heat being applied from the top and bottom of the melting and then solidifying body and FIG. 12 of that patent, col. 15 lines 4-19, showing the same, as well as partially melted material 89, atop still particulate material (no reference numeral). Such a process is very difficult with very thin powder bed thickness. Melting the full depth of the silicon powder at any one location must be avoided everywhere. Otherwise, the thin layer of molten material will ball up, leaving holes to form adjacent the region of balling. Thus, using a powder and setter technology, it is difficult if not impossible to obtain wafers of thinner than 200 microns, with silicon (and any other semi-conductor with similarly high surface tension) because it is very difficult to melt only a portion of the depth of such a shallow body of powder particles, without melting all of the rest of its depth at one time, which would result in the balling up of that region of molten semi-conductor.

Fabricating a wafer from powder particles also presents another problem related to large thickness steps from one location to another, which problem is due to the fact that powder is at most 50% dense, and more typically 33% dense. Due to this problem, it is not possible to have a region more than 20%-30% thicker than an adjacent location without having a gross lack of flatness on the opposite face of the formed body and a markedly thin portion at the transition between the thicker and relatively thinner regions. (Stated differently, the ratio of thicknesses of adjacent regions cannot be greater than 1.3:1, or maybe even as small as 1.2:1, depending on the particle sizes, required part quality and dimensional uniformity.) The density of powder is about ⅓ the density of solidified material. (The particle size has some effect on this fraction.) The setter apparatus is illustrated with respect to FIGS. 9 and 12 of the '084 patent. If a recess 73 in a setter 70 is to be used to form a perimeter in the finished product, that is raised above a thinner interior region, formed at the region 74 of the setter, both the recess 73 and the shallower region 74 must initially be provided with enough depth/volume of particles to create the finished product.

Consider what would happen for the following set up. If a recess 74 in a setter were 100 microns deep and the wafer thickness was desired to be 300 microns thick in the main, interior region, then, for the main region, it would be necessary to pile powder above this region to a depth of three times the final 300 micron thickness, for a total of 900 microns. This would mean that above the trench, the thickness would be 1000 microns. After melting, the thickness of the finished body would be approximately ⅓ the depth of the powder that was above it. Thus, in the interior region, it would be 300 microns thick. Above the trench, it would be ⅓×1000 microns=333 microns thick. But, the trench is 100 microns deeper than the interior. Thus, thickness of the perimeter would be 333 microns as measured from the bottom of the trench, 100 microns below the center region, and the thickness of the interior would be 300 microns, measured from the flat interior region. The back surface of the formed body would be far from flat, because the opposite surfaces would be offset by the 100 microns of the trench. The distance to the back surface above the trench from the bottom of the trench would be 333 microns. The distance from the level of the bottom of the trench to the back surface above the interior region would be 400 microns, because the thickness above the interior region is 300 microns, and the interior region is spaced 100 microns away from the bottom of the 100 micron deep trench. Thus, adjacent regions of the back surface at the interface between the perimeter above the trench and the region above the interior will be at different distances from the bottom of the trench of 333 microns and 400 microns, respectively, leaving a jog of 67 microns between the two.

Due to the lack of flatness, there will be a thinner portion adjacent the corner between the trench and the interior region. This thinner portion could be weaker, or constitute a stress raiser, and is generally undesirable. The lack of flatness is worse for deeper trenches, provided to establish larger extensions around the perimeter. This is because the difference due to the added extension would be present in the absolute, to the same degree as the increased extension, but the added powder due to this added extension would compress to ⅓ the added amount. Thus, for a perimeter trench that is 200 microns deep, the jog at the back surface would be a difference of 124 microns (=300−((1100 microns/3)−200).

The foregoing considerations can also be expressed in terms of the ratio of the size of the raised, extended portion of the thicker region, as compared to the thickness of the thinner region. If the surface of the thinner region is considered a base level, then with the settering method, it is typically not possible to fabricate a body with a raised portion that extends beyond the base level surface to such a degree that the ratio of the raised portion extension above the base level to the thickness of the thinner region is larger than 0.11. In any case, the '084 patent does not disclose any examples of bodies with larger ratios. The only example disclosed therein has a thin region of 900 microns, with a raised portion at most 100 microns, resulting in a ratio of 100/900=0.11.

Thus, an object of an invention hereof is a semi-conductor wafer that is thinner, in certain controlled regions, than a standard 180-200 micron thick semi-conductor wafer, as thin in significantly large portions as 80 microns, and even in some cases as thin as 50-60 microns, but which thinner wafer is strong and robust enough to be used in conventional, or nearly conventional photovoltaic applications. Another object of an invention hereof is a semi-conductor wafer that has relatively less semi-conductor in its volume than a standard semiconductor wafer of the same surface area. Still another object of an invention hereof is a method of making such a locally thinner, but still strong wafer. Yet another object of an invention hereof is a method of making such a lower volume semi-conductor wafer. Yet another object of inventions hereof is to create wafers with three-dimensional geometry. A further object of inventions hereof is to create such thin wafers with acceptable interstitial oxygen content, for instance at any value less than $6\times10^{17}$ atoms/cc, and preferably less than $2\times10^{17}$ atoms/cc. A related object is to create such wafers with total oxygen of any value less than $8.75\times10^{17}$ atoms/cc (=10 ppmw) and preferably less than $5.25\times10^{17}$ atoms/cc (=6 ppmw) as measured by IGA. Yet another object is a semiconductor wafer that has regions of different thicknesses, where adjacent regions have a thickness ratio of greater than 1.28:1. A related object to the foregoing is a semiconductor wafer that has regions of different thicknesses, where the extension of the thicker region above the base level of the thinner region is greater than 0.11 times the thickness of the thinner region. Still another object of an invention hereof is a semi-conductor wafer that has a regions of different thicknesses, where the thinner region is preferably thinner than 180 microns and in a specific embodiment, extends over at least 80% of the surface area and as much as 95% of the surface area.

BRIEF SUMMARY

A general invention hereof is a semi-conductor wafer that has regions that are relatively thicker than other regions, which thicker regions are in specifically designed or controlled locations of the wafer. Another general invention hereof is a semi-conductor wafer that has a surface that is generally level, at a base level, with raised portions projecting away from the base level, it also being that the raised portions are in specifically designed or controlled locations of the wafer. A more specific invention hereof is a semi-conductor wafer that has a relatively thinner interior region, and a relatively thicker perimeter region, thus consuming less semi-conductor material than a uniformly thick wafer, and also having higher efficiency than a wafer that is relatively thicker over the majority of its surface area. Another more specific invention hereof is a wafer that has relatively thin regions, and one or more thicker discrete regions, such as spaced apart ribs, landings, stripes, islands, such as rectangles, circles, other geometries etc., thus providing strengthened regions for electrical and mechanical connections and other couplings. In general, an invention hereof is a wafer that is thinner than 180 microns and may be as thin as 60 micron, more typically though, thicker than 80 microns, and in a preferred embodiment, the thinner region extends over at least 80% of the surface area of the body. Inventions hereof also include wafers that have thin sections of thinner than 180 microns, and thicker sections, where the ratio of the thicknesses is at least 1.3:1. Yet another invention hereof is a relatively thin wafer, with relatively thicker portions, which has interstitial oxygen content of less than $6\times10^{17}$ atoms/cc, and more preferred, which has less than $2\times10^{17}$ atoms/cc and most preferably, no detectable interstitial oxygen. Further, such wafers have less than $8.75\times10^{17}$ atoms/cc (=10 ppmw) and preferably less than $5.25\times10^{17}$ atoms/cc (=6 ppmw) total oxygen as measured by IGA. Still another invention hereof is a wafer with relatively thin portions and relatively thick portions, in which the relatively thin portions are less than 180 microns thick, and the relatively thicker portions extend beyond the thinner portions by at least 40 and as much as 120-200 microns.

All of the inventions mentioned above can beneficially be composed of semi-conductor that has relatively small amounts, if any, of interstitial oxygen, for instance less than $6\times10^{17}$ atoms/cc, and preferably less than $2\times10^{17}$ atoms/cc. Although the difference between these values may not seem particularly significant, operationally, the difference between greater than $6\times10^{17}$ atoms/cc and less than that value, and preferably less than $2 \times 10^{17}$ atoms/cc, is very significant in terms of resulting photovoltaic performance. Semi-conductors for photovoltaic use with $6 \times 10^{17}$ atoms/cc or greater interstitial oxygen produce lower efficiency and light induced degradation >2%, while wafers having interstitial oxygen of $2 \times 10^{17}$ atoms/cc or less would be preferable and would exhibit significantly lower light induced degradation of <2%. All of the inventions mentioned above can also beneficially be composed of semi-conductor that has relatively small amounts, if any, of total oxygen, for instance less than $8.75 \times 10^{17}$ atoms/cc (=10 ppmw) and preferably less than $5.25 \times 10^{17}$ atoms/cc (=6 ppmw).

Additional inventions hereof include solar cells composed of such wafers, some of which may be provided with electrical connections at relatively thicker regions, such as mentioned above, and also solar modules composed of such solar cells that are connected to each other via such electrical connections and thicker wafer portions, also taking advantage of the high efficiency due to the overall thinness of the constituent wafers, as described above. Additional inventions hereof are methods of making any and all of the foregoing varied thickness wafers, cells and modules.

In one embodiment, the thickness of the entire region around the perimeter of the wafer can be thicker than the thickness in the interior, or center region. For example, the interior region of the wafer can be approximately 100 microns thick, with a perimeter region that is approximately 180-200 microns thick. The thicker perimeter could extend typically, approximately 1-3 mm inward from the edge as shown in FIG. 1. In this way, the strength of the edge of the wafer will be similar to the strength of the edge of a normal, uniform thickness wafer.

As described below, the thicker edges can take many forms and have many profiles.

In another embodiment, specifically chosen regions within the interior of the wafer can be relatively thicker than other regions. For example, a wafer can be made having stripes of greater thickness in the regions which will later receive the interconnection bus bars. FIG. 2 shows an example of a wafer with such thickened stripes. Such stripes provide sturdier, more crack resistant regions to withstand the stresses of electrical connections, such as soldering, or adhesives to thicker metal conductors.

Other embodiments having combinations of perimeter and interior relative thickening are contemplated as inventions hereof, and are described below. Embodiments where only portions of the perimeter or an interior region are thickened are also considered to be inventions hereof, and are described below.

Another invention hereof is a solar cell made using such thick bordered, or thick regions, thin interior wafers. They are lighter, less expensive, more durable and more efficient than solar cells having conventional, uniform thickness semiconductor wafers as their solar energy collectors. The electrical connections required to connect one cell to another to fabricate a module can be provided to the wafers with less risk of damage.

Still another invention hereof is a module composed of solar cells of inventions hereof, composed of semiconductor wafers of inventions hereof. Such modules exhibit higher efficiency, due to the thinness of the wafers, but are not unacceptably fragile because of the strength provided by either one or both of a relatively thicker perimeter region and relatively thicker regions for electrical connections.

Inventions hereof also are methods of making such thick bordered, thin interior wafers, or wafers with selectively thick regions and otherwise thin regions. One such method is based on a Direct Wafer® (DW) wafer making method, with significant, inventive modifications disclosed herein. A basic method is described fully in the Direct Wafer technology patent referenced above. Some modifications of the DW technology methods that are inventions hereof are described below. Wafers made based on the modified Direct Wafer® method have interstitial oxygen content of less than $6 \times 10^{17}$ atoms/cc, and typically less than $2 \times 10^{17}$ atoms/cc even as little as no detectable interstitial oxygen. Further, such wafers have less than $8.75 \times 10^{17}$ atoms/cc (=10 ppmw) and typically less than $5.25 \times 10^{17}$ atoms/cc (=6 ppmw) total oxygen.

The thickness of a wafer formed on a mold by DW technology methods is dependent on the amount of heat extracted from the molten and then solidified semi-conductor material at the location of interest, and also somewhat on the rate of heat extraction (the heat flow) at that location. The thickness of silicon solidified has an upper limit, which is based on the total amount of heat extracted. This is because a specific amount of heat must be extracted from the liquid to freeze it. The amount is called the latent heat of fusion. For instance, for silicon, the latent heat of fusion is 4.138 $kJ/cm^2$. Thus, to freeze a volume of silicon, the local heat extraction must be 41.4 $J/cm^2$ for every 100 microns of wafer thickness. This assumes that all of the heat extracted from the melt is from the latent heat. Stated another way, this assumes that the melt was already exactly at freezing temperature. However, if this amount of heat is extracted too slowly—over too long a period of time—heat will be conducted into the solidified wafer from the warmer melt below it, thereby reducing the net heat extracted from the molten material, and thus reducing the thickness of the resulting wafer. Thus, in that slow extraction case, even if the requisite amount of heat is extracted, the melt will re-warm the solidifying material, and thus it will not freeze to the same extent.

It has been determined, as an invention hereof, that relatively more heat extracted at one region, as compared to at another region, results in formation of a relatively thicker wafer region at the location with relatively more heat extraction. Conversely, relatively less heat extraction in one region as compared to another results in formation of a relatively thinner wafer region at the location with relatively less heat extraction. Generally, locations experiencing larger heat flow also have more heat extraction, and locations experiencing lesser heat flow also have less heat extraction.

For reasons that will be explained below, the methods that are used to create wafers of inventions hereof differ from Direct Wafer® Technology methods in an important way, such that the body that imparts shape to the wafer, which is analogous to a mold-sheet or mold as those terms are used in the DW Technology patents, does not function as a conventional mold. The body's function is explained below. But, for this reason, it is generally referred to herein as a template, or, in some cases, as a pattern, and not as a mold.

Considering, for example, to form a wafer having a relatively thicker perimeter region, this can be achieved by controlling the heat flow from the semi-conductor melt to the template, such that there is more heat extracted from the molten material around the perimeter, in the regions where it is desired that the wafer be thicker, as compared to the interior region. The wafer as formed will be thicker around the perimeter than it is in the interior. Similarly, for relatively thicker stripes or other geometries, particularly to be associated with electrical connections, relatively more heat extracted at the locations desired to be relatively thicker, will result in such relatively greater thickness, as compared to the regions where there is relatively less heat extracted.

The following discusses many different ways to provide controlled, designed, differences in heat extraction from one specifically located, designed, region to another, including, but not limited to: providing one or more regions of a coating on the template that retard (or if desired, enhance) heat extraction as compared to uncoated regions; providing regions with different template thicknesses at different template locations, and thus with more or less thermal mass at the different locations, thicker regions generally having more thermal mass and experiencing more heat extraction, as compared to thinner regions, with less thermal mass and less heat extraction; providing different amounts of differential pressure at different locations across the template surface; providing locally different thermal properties within the template itself, such as by including voids, so that there is less thermal mass, or inserts of different materials, so that the heat extraction differs at these different locations; providing different degrees of permeability in the template at different locations, thereby providing different degrees of heat extraction, either due to the permeability itself, or due to different degree of pressure differential arising from the different degrees of permeability.

The following discusses formation of semi-conductor wafers for primarily photovoltaic uses, for instance in the formation of a solar collecting wafer. Typical wafers are 156 mm by 156 mm square, establishing a solar collecting surface, which is generally planar. They have a thickness, which is orthogonal to this plane, which is generally between 180-200 microns thick. It is this thickness dimension that is primarily a focus of the following discussion, and the terms thin and thick will generally be used to refer to the size of structures in this dimension that is orthogonal to the plane of the solar collecting surface. Structures are described that have a dimension within the plane of the solar collecting surface. The terms wide and narrow, or similar, are generally used to refer to the size of these structures in the plane of the solar collecting surface. It is also possible to form wafers for other uses. The examples set forth for photovoltaic use are for purposes of explanation only, and should not be taken to be limiting inventions claimed herein only to photovoltaic uses, unless specified in the claims.

Wafers made according to the direct from melt methods discussed herein have the desired low oxygen levels of, having interstitial oxygen content of less than $6\times10^{17}$ atoms/cc, and typically less than $2\times10^{17}$ atoms/cc and even as little as no detectable interstitial oxygen. Further, such wafers have less than $8.75\times10^{17}$ atoms/cc (=10 ppmw) and typically less than $5.25\times10^{17}$ atoms/cc (=6 ppmw) total oxygen These and other objects and aspects of inventions disclosed herein will be better understood with reference to the Figures of the Drawing, of which:

BRIEF DESCRIPTION OF THE FIGURES OF THE DRAWING

FIG. 11 is a schematic representation of two wafers such as are shown in FIG. 11, with landings, and islands and a thin interior, provided with metallization and interconnected with two bus-wires;

FIG. 11B is a schematic representation of an enlarged view of portion B of FIG. 11, showing a portion of a single bus-wire and metallization, and a landing and an island;

FIG. 11A is a partially exploded view of the enlarged portion of the wafer shown in FIG. 11B, with the bus-bar element removed to show the metallization underneath;

FIGS. 12A, 12B, 12C, 12D and 12E, show, schematically, stages of application of a functional layer that is deposited in two steps to provide a wafer having a thin interior and a thicker perimeter, with:

FIG. 12A showing a template with a first functional layer provided over its entire surface;

FIG. 12B showing the template of FIG. 12A with a mask around its perimeter;

FIG. 12C showing the masked template of FIG. 12B with a second functional layer deposited within the interior of the mask;

FIG. 12D showing the template of FIG. 12C with the mask removed, showing two stacked functional layers of differing surface areas; and FIG. 12E showing the template of FIG. 12D flipped so that its melt-ward side faces downward, as it would during typical use;

FIGS. 13A, 13B, 13C and 13D, show, schematically, stages of application of two interposer layers with:

FIG. 13A showing a template alone;

FIG. 13B showing the template of FIG. 13A with a first interposer layer covering its entire surface;

FIG. 13C showing the covered template of FIG. 13B with an additional interposer layer covering the interior, to produce a wafer having a thin interior and a thicker perimeter; and FIG. 13D showing the template of FIG. 13C, flipped so that its melt-ward side faces downward, as it would during use;

DETAILED DESCRIPTION

Figure 1:
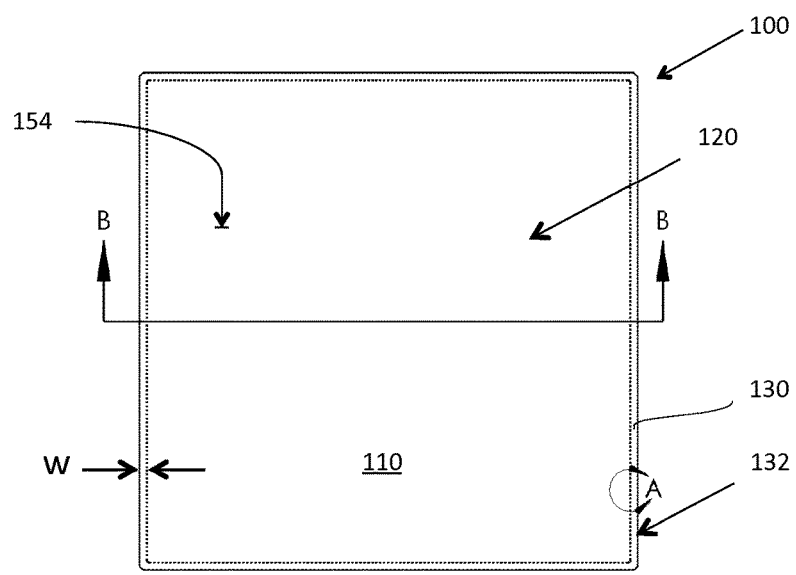
FIG. 1 is a schematic representation of a wafer of an invention hereof, having a relatively thin 100 micron thick interior region and a relatively thick 200 micron thick perimeter region, the interior region being thinner than a standard 180-200 micron thick silicon PV wafer, the thick perimeter being approximately 2 mm wide, and having a sloped inner edge.

Inventions disclosed herein relate to semi-conductor wafers and methods of forming such wafers. They are particularly applicable to semi-conductor wafers for use in photovoltaic assemblies, and methods of fabricating such wafers and such assemblies, although they can be used for formation of wafer-like articles for other uses. Silicon wafers are discussed as an example, but the inventions are not limited to silicon as the semi-conductor. Similarly, although photovoltaic uses are discussed as exemplary, the methods disclosed herein can be used with any semi-conductor article manufactured from a volume of molten material, using a porous body such as a template described herein where it is desired to have regions that are thinner than others, which are thicker, and also, in particular, where the thin regions are quite thin, and are strengthened to some extent by presence of the thickened regions.

As discussed above, inventions disclosed herein can relate in general to wafers that are thinner, over most of their surface area, than are standard photovoltaic wafers, which are generally 180-200 microns thick. Wafers of inventions hereof also have thicker regions, which can help to provide greater strength than would be present with a wafer having uniform thickness of less than 180 microns, such as thicker perimeter regions, or thicker stripes, islands, extending ribs, landings, tabs or other geometries for electrical connections. Features other than strength can also be provided by these other thicker structures, such as enhanced robustness for electrical connection. As used herein, when it is stated that a wafer has a thinner interior region, it is meant the majority of the interior region is thinner, excluding these other geometries, such as stripes, islands, etc. In general, at least 50% of the interior region will be of the thinner size, and more typically greater than 80% or 90% will be of the thinner size. Generally, wafers of inventions hereof have interior regions that are thinner than 140 microns, and preferably, thinner than 100 microns, to as thin as 60 microns. It may be possible, with special measures taken, to produce wafers even thinner than 60 microns. In general, the ratio of the relatively thicker regions to the relatively thinner regions will be between 1.3 to 1 and 3 to 1, however, they can be smaller or larger. In a most general case, it is thought that for photovoltaic use, the thinner region will not likely be thinner than 50 microns, and the thicker region will not likely be thicker than 250 microns. A wafer with both of these extremes of thickness is possible in the future, although it is more likely that both of these limits would not be found in the same wafer under current practices.

The meaning of thicker regions and thinner regions as used herein, requires some explanation due to natural variations in thickness of conventional wire-sawn photovoltaic wafers. Wire-sawn wafers typically take on a wedge shape, in the direction of sawing, because as the cutting wire enters the leading edge of the brick to cut off a wafer, the cutting slurry, for instance SiC, breaks down and also carries abraded Si with it, resulting in a change in kerf thickness as the wire travels through to the exiting edge of the brick being sawn. Thus, more material is removed from the brick at the trailing portion of the cutting path than at the leading portion. A typical thickness variation for a sawn wafer would be between 10 and 30 microns, with the change in thickness being systematic in nature from one edge to the other. The thickness of the wafer parallel to the length of the cutting wire is approximately equal from one end of the wire to the other. The variation arises in the direction along which the wire moves. In general, the difference in thickness within a wafer due to these saw-cut related causes is less than or equal to 20% of the thicker portion.

As used herein, when it is mentioned that one region of a wafer of an invention hereof is thicker than another region, it is meant that a specifically designed, local thickness variation is present and has been created. The placement of the variations is designed and specifically controlled. The term thicker, is intended to mean something different from the variation due to sawing discussed above, from the leading edge to the trailing edge of the saw cut. Considered from a percentage standpoint, the difference in thickness within a wafer due to the specifically designed, locally controlled differences is typically greater than or equal to 20% of the thickness of the thicker portion.

As used herein, a thickness of a region means an average thickness, such as measured using capacitive thickness sensors from one wafer surface to the opposite wafer surface, which creates an x-y map of thickness by position. For instance considering a wafer having a large, thin interior region, and a second, thicker, region (either a continuous region such as a perimeter, or non-contiguous region sections such as islands or landings, as discussed below), such an x-y map of the wafer surface can exclude the second region(s) (of greater thickness). There may be variations in thickness within the first, thinner region. (For instance, a typical TTV or Total Thickness Variation calculated as maximum minus minimum of all points on a map of wafers made according to inventions hereof may range from 40 to 80 microns for a 200 micron thick wafer) but the average thickness of the first region will be significantly (>20%) less than the average thickness of the second region.

In the case of a narrow perimeter for the $2^{nd}$ region, the measurement method for determining thickness can be different, such as by edge vision cameras, because the capacitive sensors have a measurement spot of ~5 mm and cannot detect narrow ridges.

The following will first discuss several different types and geometries of wafers of inventions hereof. It will then discuss methods of forming such wafers.

FIG. 1 shows, schematically, a wafer 100, having an expanse 110 of an interior region 120, which is thinner than 180 microns, for instance approximately 100 microns. The perimeter region 130 can be thicker, for instance 180-250 microns thick, which includes within its range, the range for the overall thickness of a standard silicon PV wafer. Thus, the ratio of the thickness of the thicker portion to that of the thinner portion would be at least 1.8:1, which ratio would not be achievable using a powder based technology, such as disclosed in the '084 patent. The thicker perimeter 130 could extend typically, 0.5-3 mm inward from the edge, as shown in FIG. 1, preferably 1-2 mm. Thus, its width w could be approximately 1-3 mm. The inner corner 134 is sloped, from the higher, thicker perimeter 130, to the lower, thinner interior 120. The strength of the edge 132 of the wafer 100 will be similar to the strength of the edge of a normal wafer. The embodiment shown in FIG. 1 has a perimeter width w of two mm, with a gradual transitional region from thicker to thinner of approximately 0.4 mm.

In fact, in some ways, the thicker perimeter 130 will be stronger than an edge of the same thickness in a wafer of uniform thickness of the normal case. For example, when a wafer 100 of an invention hereof, with a relatively thin center 110 and a relatively thick edge 132, bumps against a wafer carrier or other piece of hardware, it will do so with less force than would a uniform thickness wafer, because the on average thinner wafer 100 will have less mass and therefore less momentum, and therefore require lower forces to stop. Further, a wafer with a thinner interior section can sustain far more deflection and bending in this interior region as compared with a wafer of standard thickness. Even the thicker border region can sustain more bending than a full wafer of the same thickness, because the former bends like a beam, while the latter behaves like a plate, as is understood in the art of the mechanics of solids. Thus, a thin interior, thick perimeter wafer is in general tougher and more robust than a normal wafer of uniform normal thickness, or a thin wafer of uniform (albeit thinner) thickness.

Furthermore, such a wafer, due to its overall relative thinness, other than at its perimeter or other thicker regions, has a higher efficiency in the cell architectures that result in low surface combination and good light trapping, such as PERC mentioned above. Such a thick border (or thick regions) and thin interior wafer, is composed of significantly less semiconductor material than would be a conventional, uniformly thick wafer with the same or worse strength or the same or worse efficiency, or both.

Thus, such a wafer of an invention hereof has significantly lower costs of materials because it is composed of less semi-conductor material than a uniform thickness wafer. For instance, a wafer of the dimensions mentioned above, 100 micron thick interior, 200 micron thick, 2 mm wide perimeter, is composed of approximately 60% or less of the semi-conductor that would be needed for a uniform thickness 200 micron thick wafer.

For example, the volume of a standard wafer, which is 156 mm×156 mm×200 microns thick, is 4.87 cubic centimeters and its mass is approximately 11.2 grams. A wafer that has a center section that is 100 microns thick and a 2 mm wide border that is 200 microns thick, has a volume of 2.56 cubic centimeters and a mass of approximately 5.88 grams, for a savings of approximately 50% of the mass of a standard wafer.

As used herein, a perimeter region is a region that substantially surrounds the entire boundary of a wafer of any shape, be it square, rectangular, circular, or any other shape In another embodiment, certain regions within the interior of a wafer are made thicker, for specific functional reasons. For example, as shown schematically with reference to FIG. 2, a wafer 200 may have stripes 240a, 240b, 240i (intermediate stripes not shown), 240c, of greater thickness, located in regions of a wafer 200 that will later receive interconnection bus bars. The stripes 240a-240c are set in an interior region 210 that is otherwise thinner than a normal 180-200 micron thick wafer, for instance having a thickness of 100 microns. The stripes may be as thick as 250 microns, although they need not be for this purpose. It is believed that a thickness for electrical connections of between 150 and 250 microns is beneficial. Thus, the ratio of the thickness of the thicker portion to that of the thinner portion would be at least 1.5:1, which ratio would not be achievable using a powder based technology, such as disclosed in the '084 patent.

The thickness of the perimeter regions and any thicker interior regions may be chosen in relation to the thickness of the central region. Typically, the ratio of the thickness of thick regions to thin regions is between 1.28 to 1 and 3 to 1, but may be as large as 5 to 1 for some typical uses. Stated a different way, in terms of the ratio of the size of the extension of the thicker region beyond the base level of the surface of the thinner region, to the thickness of the thinner region, that ratio is typically between 0.28 and 4.

As is known in the art, for certain types of cell architecture, the efficiency of a solar cell that has a relatively thinner wafer can be higher than a solar cell that has a relatively thicker wafer. The types of cell architectures for which this is true include, but are not limited to: PERC (Passivated Emitter Rear Contact) and PASHA. In a PASHA structure, the back of the cell consists of a heavily doped region, creating a back surface field, which, as known in the art, repels minority carriers toward the front of the cell. The conductor on the back of the cell conductor is in the form of fingers, rather than a full area of metal. The silicon surface between these fingers may be passivated, which in combination with the back surface field, provides comprehensive passivation. Infra-red light that reaches the back of the cell can encounter a good optical reflector and re-enter the cell. This structure may be particularly well suited to a thin wafer, because the lesser metal coverage on the back will lead to less bowing of the wafer due to the thermal expansion mismatch between silicon and rear metal. This follows from several physical causes.

Using a thinner wafer can increase the efficiency of a cell made on such a wafer by increasing both the open circuit voltage ($V_{oc}$) and the short circuit current ($I_{sc}$). $V_{oc}$ goes up because there is less recombination of minority carriers in the bulk of the wafer, because there is less bulk—that is, precisely because the wafer is thinner. The current can also be higher. This is because the photo generated carriers, which result from the absorption of infra-red photons near the back of cell do not have as far to travel to the p-n junction at the front of the cell. Hence, fewer of these photo-generated carriers are lost to recombination) and therefore, more arrive at the junction capable of creating current external to the cell.

To take full advantage of these improvements, the cell should preferably achieve excellent light trapping, so that the infra red light bounces back and forth many times within the cell and can be available to be absorbed. In particular, there should preferably be good optical reflection at the back of the cell. This is present with a PERC back, known in the art. The gain in efficiency that comes from decreased thickness is actually greater for material with lower minority carrier lifetime—a prime measure of electronic quality. This is because in lower lifetime material, the photo generated carriers created at the back of a cell are more likely to recombine before they reach the front of the cell, as compared to a similar case with high lifetime material. Thus, shortening this distance that photo generated carriers have to travel is more advantageous for lower lifetime material.

Figure 3:
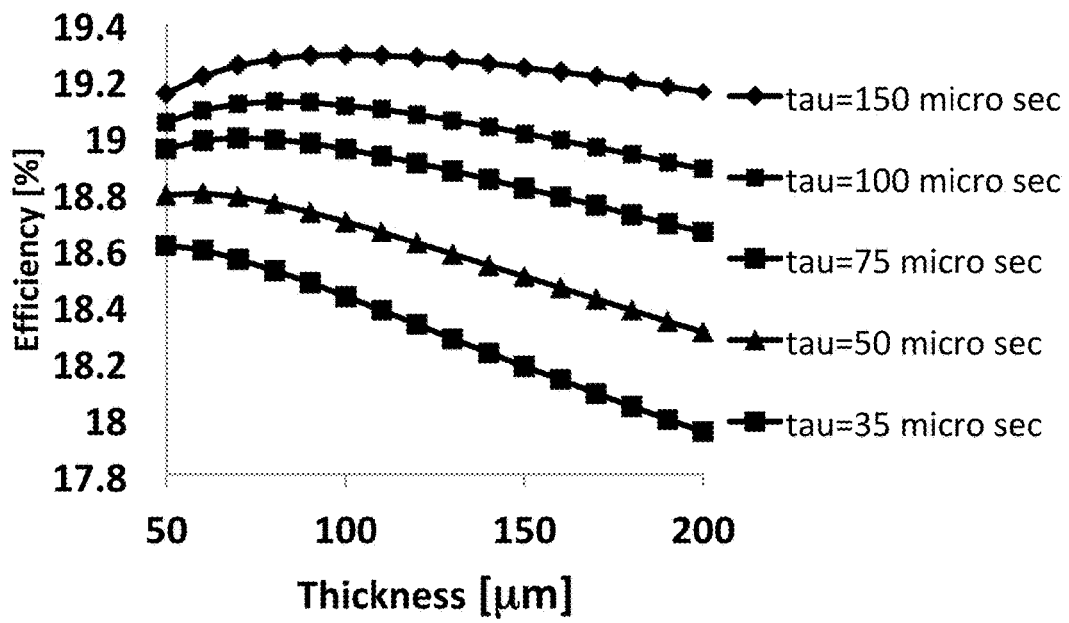
FIG. 3 is a graphical representation showing the relationship between cell efficiency and wafer thickness a PERC cell structure.

FIG. 3 shows, schematically, the relationship between cell efficiency (the vertical scale) and wafer thickness (horizontal scale). This graph was created from simulation software known as PC1D, which is widely used in the PV industry. It assumes a PERC back with an optical reflectivity of 96% and a surface recombination velocity of 20 cm/sec. The family of curves is for different values of minority carrier lifetime (tau). In general, a standard 180-200 micron thick wafer has tau of approximately 150 microseconds, and has efficiency between approximately 19% and 19.1%. Reducing the thickness of such a standard wafer to 100 microns raises this efficiency only slightly to approximately 19.3%. In contrast, a wafer of a lesser tau, for instance 35 microseconds, which, at a standard thickness of 180-200 microns would have efficiency of only approximately 18%, can have a much higher efficiency, approaching 18.4%, if it has a lesser thickness of only 100 microns. Thus, reducing the thickness of wafers with relatively lesser tau has a larger benefit on efficiency gain of those lesser tau wafers, than would reducing the thickness of wafers having relatively greater tau. A further advantage of thinner wafers is that the minority carrier injection level is higher per unit volume because the same number of photons is absorbed in less volume of material resulting in a higher injection level. Because multi-crystalline silicon material and Direct Wafer® method fabricated material has higher bulk minority carrier lifetime that increases at higher injection levels, the thinner wafer will in practice achieve a higher tau.

Thus, the benefits of a thinner wafer as described above include both efficiency increase and a decrease in cost from using less silicon. To capture these benefits with a wafer having a first region of a wafer that is thinner and a second region of a wafer that is thicker, from a practical standpoint of balancing the benefits as compared to the extra effort that must be taken to fabricate the regions of different thicknesses, with 2015 costs of materials and efficiencies of wafers made directly from a molten body of semiconductor, the area fraction of the first region should be the majority of the wafer surface, preferably >80% and more preferably >90%.

Thus, the foregoing shows several basic embodiments of wafers that have significantly thinner regions than industry normal 180-200 micron wafers, over a significant extent of their surface area, for a few different basic geometries and patterns and uses of thin and thick regions. The foregoing has also disclosed that these thinner wafers are more efficient than thicker wafers (of the same tau), and also that these thinner wafers with selectively thicker regions are stronger than would be uniformly thin or uniformly thick wafers. Methods of making such thin wafers are discussed further below. However, before discussing the methods of making the wafers, immediately below are discussed a wide variety of different patterns of thin and thick regions.

Geometries

An important aspect of an invention hereof is to provide wafers that are quite thin in the interior, typically of thickness less than 180 microns. In preferred embodiments, the thickness will be less than 140 microns. In some embodiments, the thickness will be less than 100 microns. In some specialized embodiments, the thickness will be less than 80 microns, although it is also believed that efficiency advantages will not be present with wafers thinner than 80 microns, but yet, the cost of materials advantages will exist. In some very specialized embodiments, the thickness can be less than 60 microns. It is understood in the art that wafers of less than 180 microns are generally fragile in handling and this is definitely so for wafers of thinner than 150 microns. Further, it is understood in the art that if wafers are extremely thin, they must typically be handled by having them mounted to a carrier, which often remains attached to the wafer and becomes part of the finished module. Thus, it is a key aspect of a present invention hereof to enable handling of wafer thicknesses that would otherwise be practically impossible to handle, in particular, as free-standing wafers. To some extent, it may be considered that some wafer inventions hereof are provided with an integral carrier portion, namely, the thickened border.

Figure 2:
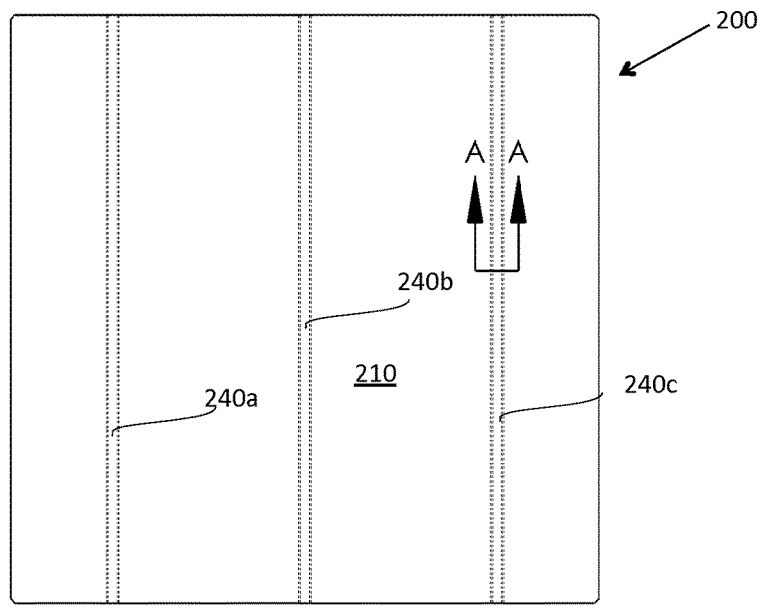
FIG. 2 is a schematic representation of a wafer of an invention hereof, having thin, 100 micron interior region and thicker 200-300 micron thick regions that comprise stripes for bus-wire connection.
Figure 2A:
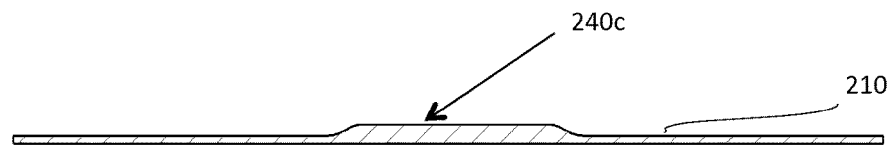
FIG. 2A is a cross-sectional, enlarged view of the wafer of FIG. 2 along lines A-A, showing that the stripe(s) is thicker than adjacent interior regions, and has sloped edges.

Already discussed above are the basic embodiments shown in FIG. 1, of a thin wafer 100 with a thickened perimeter 132, and shown in FIG. 2, of a thin wafer 200 with thickened stripes 240a, 240b, 240c, etc. for connecting to or carrying bus-bar conductors or other electrical elements. Combinations, variations, and combinations of variations are also possible.

Figure 4:
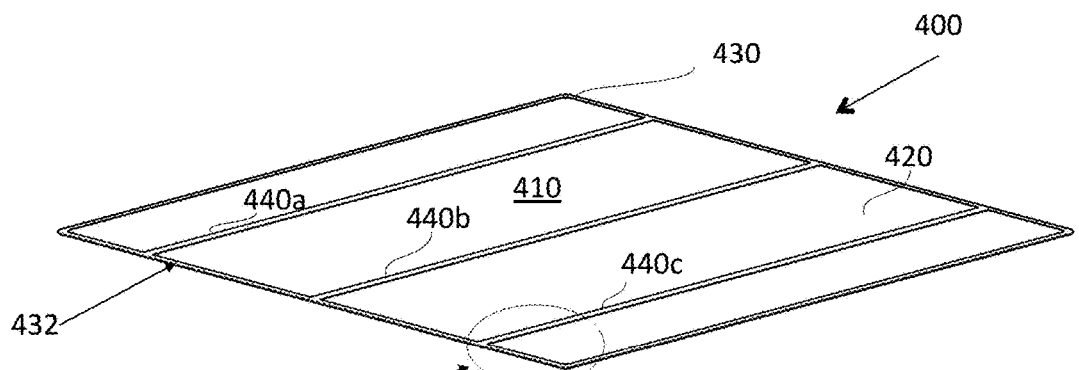
FIG. 4 is a schematic representation of a wafer of an invention hereof, having a relatively thin interior region of for instance 100 microns thick, and a relatively thicker perimeter region of approximately 150 microns thick and 1.5 mm wide and regions that comprise stripes, which are relatively thicker than the interior, being approximately 150 microns tall and 2.7 mm wide.
Figure 4A:
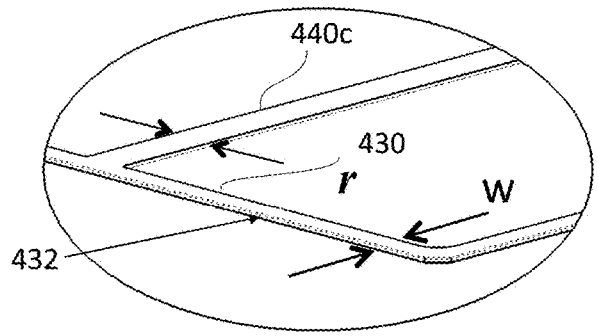
FIG. 4A is an enlarged view of region A of FIG. 4.

FIG. 4 is a schematic representation of a wafer 400 of an invention hereof, having a relatively thin interior region 410, of for instance 100 microns thick, and a relatively thicker perimeter region 430 of approximately 150-250 microns thick, in total, having a width w of approximately 1.5 mm (FIG. 4A). Additionally, regions 440a, 440b, 440c, which are in the form of stripes, are relatively thicker than the overall interior 410, being approximately 150-250 microns thick and having a width r of approximately 2.7 mm. Thus, the embodiment of wafer 400 shown in FIG. 4 has a thin interior 410 and then both of a relatively thicker perimeter 430 and relatively thicker stripes 440a, 440b, etc. The edge 432 is also shown.

Figure 5:
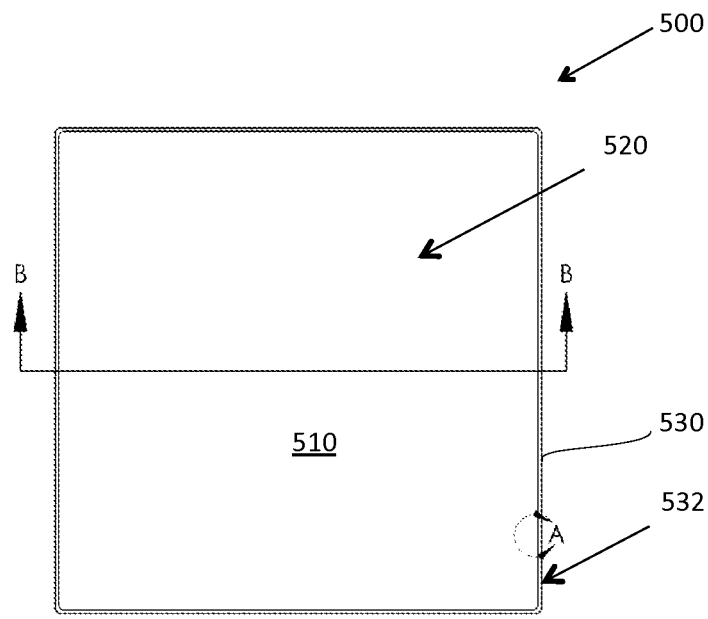
FIG. 5 is a schematic representation of a wafer of an invention hereof, having a relatively thin 100 micron interior region and a relatively thick 200 micron perimeter region, the thick perimeter being approximately 1 mm wide, and having a sharp corner at its inner edge.
Figure 5A:
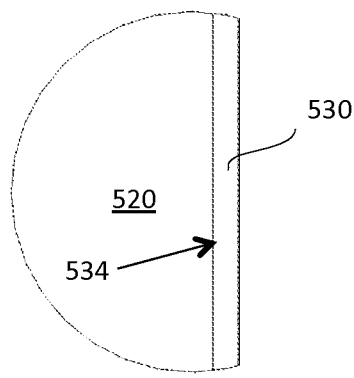
FIG. 5A is an enlarged view of a perimeter region of the wafer of FIG. 5 at A.
Figure 5B:
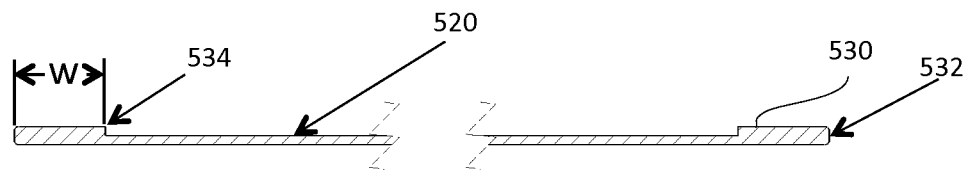
FIG. 5B is a cross-sectional view of the wafer of FIG. 5 along lines A-A, showing that the perimeter is thicker than the interior region.

FIG. 5 shows, schematically, a wafer 500, having an expanse 510 of an interior region 520, which is thinner than 180 microns, for instance approximately 100 microns. The perimeter region 530 can be thicker, for instance 200 microns thick. This thicker perimeter 530 is shown extending approximately one mm inward from the edge 532 as shown in FIG. 5B. Thus, its width w could be approximately one mm. The inner corner 534 is relatively sharp being approximately square, at the magnification shown, and thus the transition from thick to thin is abrupt. FIG. 5B shows the wafer of FIG. 5 at lines B-B. FIG. 5A shows an enlargement of the wafer of FIG. 5, at A. (None of FIG. 5, 5A or 5B are to scale.)

Figure 6:
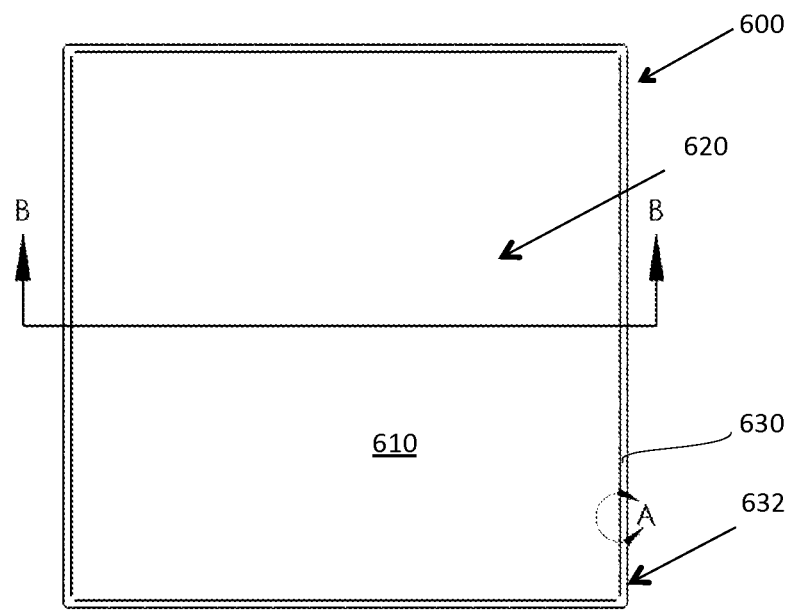
FIG. 6 is a schematic representation of a wafer of an invention hereof, having a very thin 60 micron thick interior region and a 200 micron thick perimeter region, the perimeter being approximately 2 mm wide, and having a sloped inner edge establishing a 0.4 mm transition.
Figure 6A:
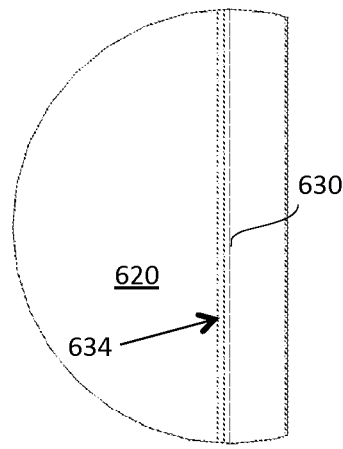
FIG. 6A is an enlarged view of a perimeter region of the wafer of FIG. 6 at A.
Figure 6B:
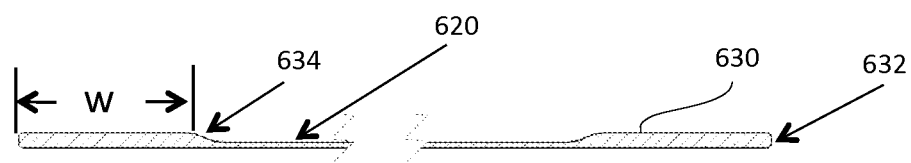
FIG. 6B is a cross-sectional view of the wafer of FIG. 6 along lines A-A, showing that the perimeter is thicker than the interior region.

FIG. 6 shows, schematically, a wafer 600, having an expanse 610 of an interior region 620, which is thinner than 180 microns, for instance approximately 60 microns. The perimeter region 630 can be thicker, for instance 200 microns thick. This thicker perimeter 630 is shown extending approximately two mm inward from the edge 632 as shown in FIG. 6. Thus, its width w could be approximately two mm. The inner corner 634 is sloped, from the higher, thicker perimeter 630, to the lower, thinner interior 620. The embodiment shown in FIG. 6 has a perimeter width w of two mm, with a gradual transitional region from thicker to thinner of approximately 0.4 mm. FIG. 6B shows the wafer of FIG. 6 at lines B-B. FIG. 6A shows an enlargement of the wafer of FIG. 6, at A. (None of FIG. 6, 6A or 6B is to scale.)

Figure 7:
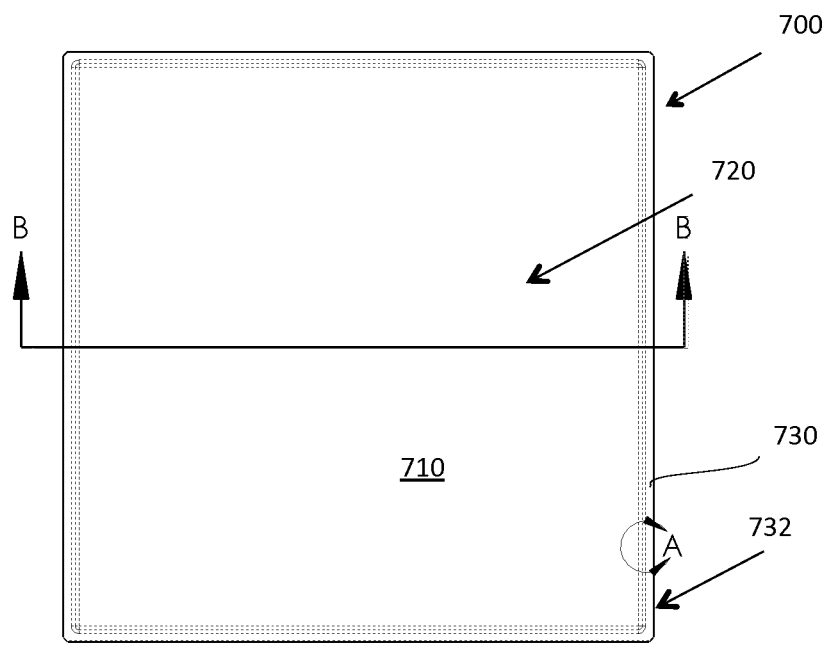
FIG. 7 is a schematic representation of a wafer of an invention hereof, having a relatively thin 100 micron interior region and a relatively thick 200 micron perimeter region, the transition from the thin interior to the thick perimeter being very gradual, such that the thicker region is approximately 2 mm wide, with a transitional region of about 2 mm to the thinness of the interior.
Figure 7A:
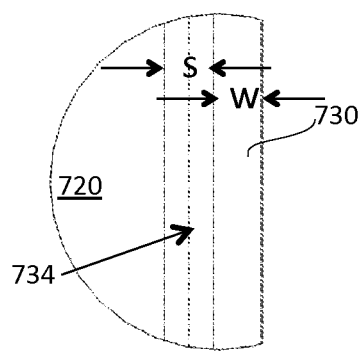
FIG. 7A is an enlarged view of a perimeter region of the wafer of FIG. 7 at A.
Figure 7B:
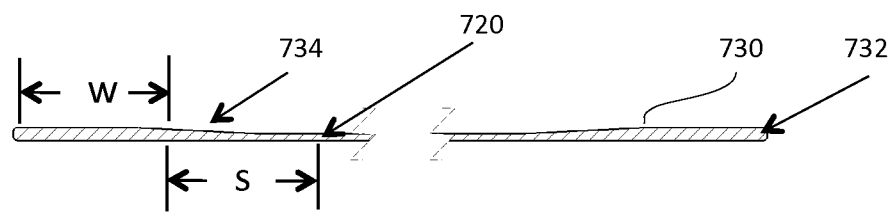
FIG. 7B is a cross-sectional view of the wafer of FIG. 7 along lines A-A, showing that the perimeter is thicker than the interior region.

FIG. 7 shows, schematically, a wafer 700, having an expanse 710 of an interior region 720, which is thinner than 180 microns, for instance approximately 100 microns. The perimeter region 730 can be thicker, for instance 200 microns thick. This thicker perimeter 730 is shown extending approximately two mm inward from the edge 732 as shown in FIG. 7. Thus, its width w could be approximately two mm. The inner transition 734 is smooth and extremely gradual and extended more than the transitional regions of the embodiments discussed above, from the higher, thicker perimeter 730, to the lower, thinner interior 720. The embodiment shown in FIG. 7 has a perimeter width w of two mm, with a transitional region from thicker to thinner having a width s of approximately two mm. FIG. 7B shows the wafer of FIG. 7 at lines B-B. FIG. 7A shows an enlargement of the wafer of FIG. 7, at A. (None of FIG. 7, 7A or 7B is to scale.)

Figure 8:
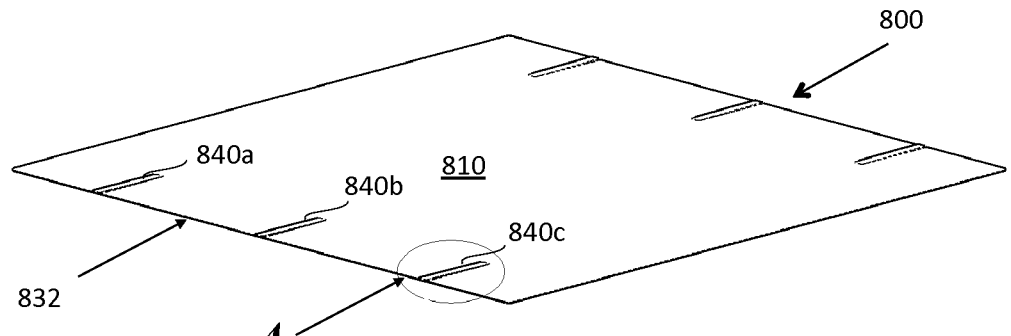
FIG. 8 is a schematic representation of a wafer of an invention hereof, having a thin 100 micron interior region and relatively thicker, spaced apart bus-wire reinforcement landings that are approximately 2.4 mm wide, extending inward from a perimeter tapering from a thickness of 200 microns at the edge to the thickness of the interior region, with no generally thicker perimeter region other than the edges of the landings.
Figure 8A:
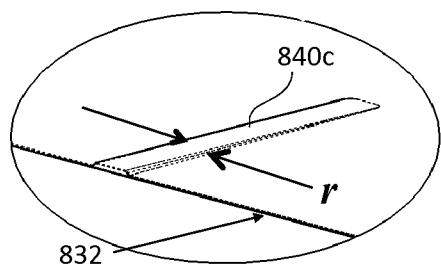
FIG. 8A is an enlarged view of region A of FIG. 8.

FIG. 8 shows an embodiment that is similar in some ways to that shown with reference to FIG. 2. A wafer 800 has short landings, or tabs 840a, 840b, 840c . . . , which are reinforcements for attachment of bus-wires to the wafer 800. The landings 840a, etc., have greater thickness near to the edges, such as 832, and taper down to the thickness of the interior region 810 after a short length. The landings may also be referred to herein as tabs. These are typically specifically and intentionally located in regions of a wafer 800 that will later receive interconnection bus bars. Typically, bus wires tend to pull hardest on the wafer near to the edges 832, and thus, this is the location where reinforcement tabs are most beneficial. The bus-wires do not pull with as much force further from the edges 832, nearer to the center 810. Thus, the overall general thickness of the wafer interior 810 can be thin, such as 100 microns or less, as discussed. The bus-wire reinforcement landings 840a, b, c, may be as thick as 200-250 microns, or even thicker, at their thickest section, although they need not be that thick for all purposes. It is believed that a thickness for electrical connections of between 150 and 250 microns is beneficial. In a typical embodiment, the reinforcement landings 840a, etc., can have a width r of approximately 2.4 mm, and will taper from 200 microns to 100 microns thick over a length that is perpendicular to the width, r, of, for instance, about 18-20 mm. Such structures may be referred to herein as bus-wire landings, reinforcements, or tabs. FIG. 8A is an enlargement of the region A of FIG. 8.

The terms landing and tab are used interchangeably herein to refer to a raised region that is adjacent an edge of a wafer, and extends from the edge, to a relatively thin, interior region. The landing itself is thicker than the interior region. It may taper from a thickest portion, near to the edge, to a thinner portion, near to the interior, which thinner portion may be as thin as the thinner interior. Also, the edge of the wafer may also itself be thicker for at least some extent of the perimeter of the wafer body, and in fact, the entire perimeter may be thicker. Thus, the landing may extend from a thicker, perimeter, to a thinner interior, and the thickness of the landing may be equal to or thicker than that of the perimeter adjacent the perimeter, and as thin as the interior, adjacent the interior.

Figure 9:
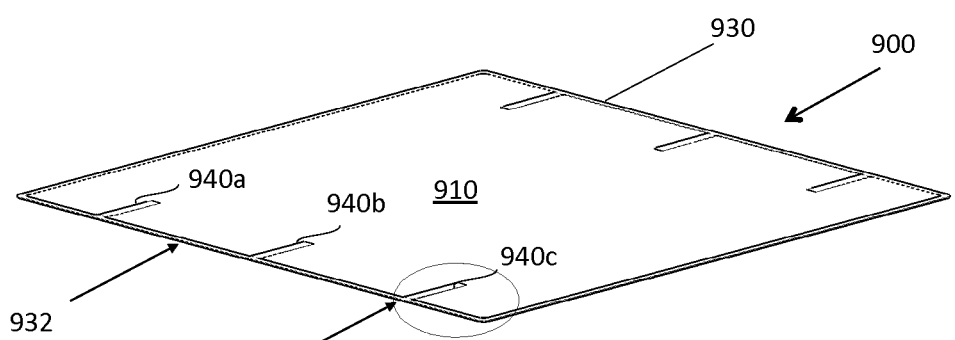
FIG. 9 is a schematic representation of a wafer of an invention hereof, having a relatively thin 100 micron interior region, and relatively thicker, border region of approximately 150 microns thick and 1.5 mm wide, and spaced apart bus-wire landings that are approximately 2.7 mm wide, extending inward from the thicker border region, tapering from a thickness of the border region at the edge, to the thickness of the interior region.
Figure 9A:
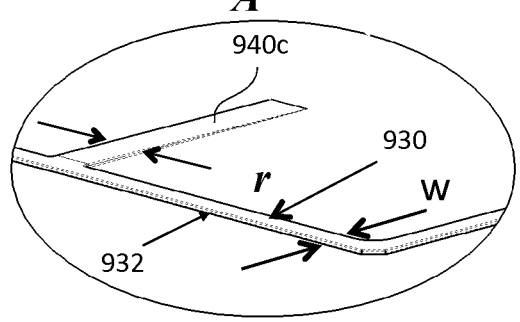
FIG. 9A is an enlarged view of region A of FIG. 9.

FIG. 9 shows an embodiment that is similar in some ways to that shown with reference to FIGS. 8 and 1, having both a thicker perimeter border 930 and also bus-wire reinforcement landings (or tabs). A wafer 900 has landings 940a, 940b, 940c . . . etc., which are reinforcements for attachment of bus-wires to the wafer 900 similar to the landings 840a,

840*b*, above. The landings 940*a*, etc., have greater thickness near to the edges, such as 932, and taper down to the thickness of the interior region 910 after a short length. These are located in regions of a wafer 900 that will later receive interconnection bus bars. The overall general thickness of the wafer interior 910 can be thin, such as 100 microns or less, as discussed. The bus-wire reinforcement landings 940*a, b, c*, etc., may be as thick as 200-250 microns, or even thicker, although they need not be that thick for all purposes. Further, this embodiment has a thick perimeter region 930 at each edge 932, which, like the embodiments discussed above, can be 200 microns thick. In a typical embodiment, the reinforcement landings 940*a*, etc., can be approximately 2.7 mm wide, and will taper from 200 microns, the same thickness as the perimeter region 930, to 100 microns over a length of about 18-20 mm. The perimeter region 930 can have a width w, as discussed above of from about 1-3 mm or larger, with 1.5 mm being beneficial. FIG. 9A is an enlargement of the region A of FIG. 9.

Figures 10, 10A:
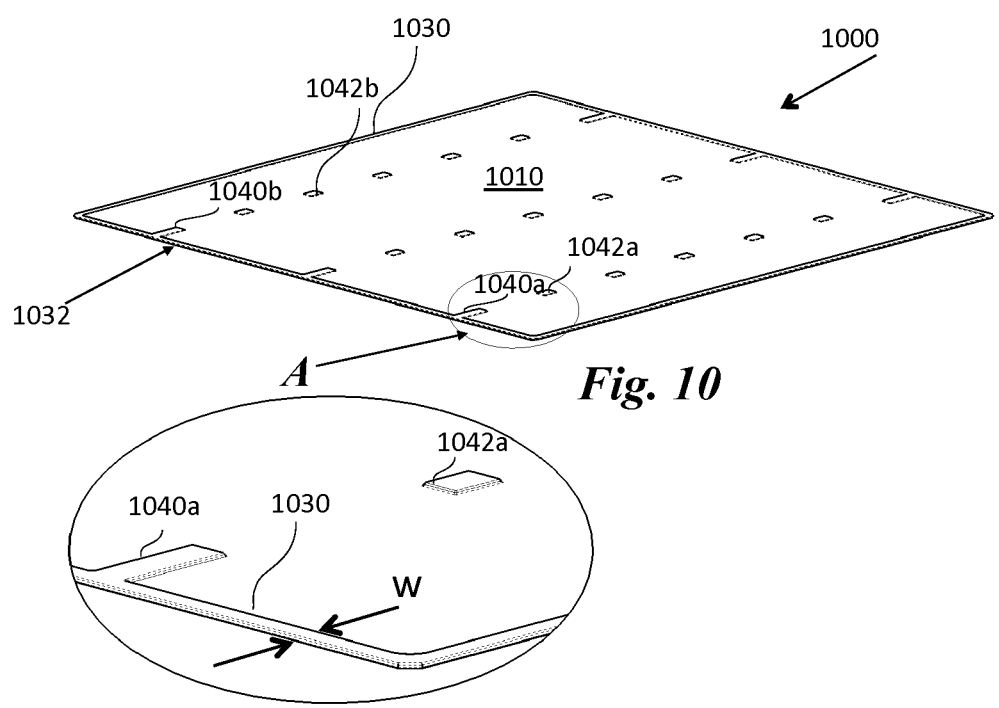
FIG. 10 (with an enlarged portion shown in FIG. 10A) is a schematic representation of a wafer of an invention hereof, having a relatively thin interior region of for instance 100 microns thick, and relatively thicker, border region of approximately 150 microns thick and 1.5 mm wide, and spaced apart bus-wire landings that are approximately 2.7 mm wide, extending inward from the thicker border region, tapering from a thickness of the border region, of approximately 150 microns at the edge, to the thickness of the interior region, for instance 100 microns, and also, bus-wire islands spaced across the width of the wafer for support of bus-wires.
FIG. 10A shows an enlarged view of the region A of FIG. 10.

FIG. 10 is a schematic representation of a wafer 1000 of an invention hereof, having a relatively thin interior region 1010, of for instance 100 microns thick, and a relatively thicker perimeter region 1030 of approximately 150-250 microns thick, having a width of approximately 1.5 mm. Additionally, raised, regions 1040*a*, 1040*b*, which are in the form of landings, or tabs, are relatively thicker than the interior, being approximately 150-250 microns tall and having a width of approximately 2.7 mm. The landings or tabs 1040*a*, 1040*b*, are for reinforcement at the ends of bus-wires, as discussed above at FIG. 4, landings 440*a*, 440*b*. In addition, thick islands 1042*a*, 1042*b* are spaced apart across the wafer, along its interior, in a line (or lines) bridging to the other side of the perimeter 1030. These raised landing 1040*a*, etc. and islands 1042*a*, etc., are for receipt of the bus-wire. The islands 1042*a*, 1042*b*, etc., are thicker than the interior 1010, for instance 150-250 microns tall, similar to the landings 1040*a*, 1040*b*. As used herein, the term island means a relatively raised region that is surrounded by relatively lower, and typically thinner regions.

FIG. 11 shows, schematically, a pair of wafers 1000*a* and 1000*b*, as shown in FIG. 10, connected by a pair of bus-wires 1170*a* and 1170*b*. FIGS. 11A and 11B show an enlarged portion A of FIG. 11. The bus portion 1172 of a metallization for a solar cell that uses the wafer 1100*a* as a component can be screen printed as a continuous stripe, which would undulate up and down over and between the landing 1040*a*, and islands 1042*a*, etc., as shown in FIGS. 11A and 11B, like a ribbon laid upon a rough surface. The bus-wire itself 1170*b* however, could lie more in a plane, with less undulation, and attach to only the raised pads 1040*a*, 1040*b* at the bus-wire ends and at the raised islands 1042*a*1, 1042*a*2, etc., along the bus-wire interior spans, leaving most of the bus wire mechanically distinct and spaced apart at locations s from the surface of the wafer 1000*a*. FIG. 11A shows an enlargement of FIG. 11 at A, with the bus-wire 1170*b* displaced somewhat to show the metallization 1172 underneath, and FIG. 11B shows this same section with the bus-wire 1170*b* in place. FIGS. 11A and 11B show that at the locations s, there is a vertical space between the surface of the wafer and its metallization 1172, and the underside of the bus-bar 1170*b*. In this way, a mismatch of thermal expansion between the silicon wafer material and the copper bus-wire can be accommodated somewhat by the spaces s between the landing pads 1040*a* and islands 1042*a*, allowing the bus-wire to flex somewhat (for instance, stretching). This may create less stress on the wafer, and reduce a potential cause for cracks and other failures, such as delamination of the bus-wire.

Thus, the embodiment of wafer 1000 shown in FIG. 10 and FIG. 11 has a thin interior 1010 and then both of a relatively thicker perimeter 1030 and landing pads 1040*a*, 1040*b*, etc. and islands 1042*a*, 1042*b*, etc.

FIG. 11 shows how the bus wires 1170*a*, 1170*b*, must be bent down from the top surface of one cell 1000*a*, to wrap under to the back surface of the adjacent cell 1000*b*. This bent wire adds to delamination stresses at the metallization at the attachment points and near the edge 1132 of the cell 1000*a*. Further, if improperly bent, the wire can actually touch the edge 1132 of the cell, thereby causing or propagating edge cracks. Thus, providing thicker attachment points, such as landings 1040*b* and islands 1042*b*1, 1042*b*2, and thickened perimeter 1030 enhances strength of the wafer and minimizes the chance of delamination and cracks.

It will be understood that the embodiments discussed above in terms of relatively thinner portions and relatively thicker portions can also be described in terms of a wafer having a general base level, for instance considering the wafer 100 of FIG. 1, the surface 120 and raised portions that extend from that base level portion, such as the raised perimeter 130. Similarly, as shown in FIG. 4, the wafer 400 has a general base level 420, from which extend raised portions such as the stripes 440*a*, 440*b*, etc. and the perimeter 430. In general, a raised portion could extend from as little as 20 microns beyond the base level surface of the thinner portion, more typically 40 microns, to as much as 120 microns, for instance in the case of a wafer with a 60 micron interior and a 180 micron perimeter. To a practical extent, such size of the extended portion also depends on the thickness of the thinner portion. In general, ratios of thicker to thinner thicknesses would not typically exceed 5:1 and more typically would be 3:1 or less.

Considerations of geometry and relative thicknesses can be thought of in terms of efficiency and handling and electrical connections. In general, the efficiency of a wafer will be dominated by the thinness of its largest extent of surface area, which is why having a thin interior of at least 80% of the surface area is important to achieve the efficiency gains. Similarly, based on the types of machinery presently in use, ease of handling is dominated by the thickness of the perimeter and the thickest portions, which need not be any more than 5% of the surface area of the wafer, or even less. Finally, ease of electrical connection is dominated by the thickness of the wafer in the locations where electrical connections need to be made, which is where the buswires are, such as stripes, and/or in some cases, where the solder connections are made, such as at landings and islands.

As discussed above, according to a relatively recently developed method of wafer fabrication, a semiconductor wafer is formed directly from a semiconductor melt, generally using techniques disclosed in U.S. Pat. No. 8,293,009, issued on Oct. 23, 2012, entitled METHODS FOR EFFICIENTLY MAKING THIN SEMICONDUCTOR BODIES FROM MOLTEN MATERIAL FOR SOLAR CELLS AND THE LIKE, by Sachs, et al., which is fully incorporated herein by reference). The technology disclosed in the '009 patent is referred to herein generally as Direct Wafer® (DW) wafer formation technology. According to that technology, a thin semi-conductor body, such as a wafer, is formed from a melt, rather than being sawn from an ingot, or grown between strings, or some other method.

As is mentioned briefly above, the thickness of a wafer formed on a template is dependent on the amount of heat extracted from the molten and then solidified semi-conductor material at the location of interest and also somewhat on the rate of heat extraction. Relatively more heat extracted at one region, as compared to another region, (if extracted at a fast enough rate) results in formation of a relatively thicker wafer region at the template location with relatively more heat extraction. Conversely, relatively less heat extracted in one region as compared to another results in a relatively thinner wafer region at the template location with relatively less heat extraction. This is illustrated with reference to FIG. 15, FIG. 16, FIG. 17, FIG. 18, FIG. 19, FIGS. 19A and 19B, FIG. 20A and FIG. 20B, and FIG. 21, and is discussed more fully below.

Thus, the propensity for a region of template to extract heat governs the thickness of the wafer that will be formed at the region in question. The following discussion explores different ways to increase the heat extraction propensity of one specifically designed and controlled region of a template, as compared to another specifically designed and controlled region and thus, typically, to increase the heat extracted and the formed wafer thickness at the location of larger heat extraction.

Before discussing these different ways to increase and vary the heat extraction propensities, the advantage of inventions hereof related to the interstitial oxygen and total oxygen content of the formed wafers will be discussed. As is mentioned above, powder based technologies suffer from undesirably high levels of interstitial oxygen in the finished formed wafer or other semi-conductor body. This is because without conducting extraordinary steps, native oxide on the powder particles results in high interstitial oxygen levels in the wafers. Relatively smaller particles result in relatively more interstitial oxygen in the finished product. To achieve relatively thinner wafers, relatively smaller particles must be used. Thus, to achieve relatively thinner wafers, relatively more interstitial oxygen will be present in the wafers. For instance, the '084 patent discusses wafers having a thickness range of between 350 and 1000 microns, and it also discusses powder of 20-1000 microns. To achieve a thinness of 350 microns would require using powder of less than 120 microns size. It is believed, based on analysis conducted by inventors hereof, that this would produce wafers having interstitial oxygen content of between $6 \times 10^{17}$ atom/cc and $2 \times 10^{18}$ atoms/cc.

Wafers made directly from molten semi-conductor are not subject to this problem of oxides and interstitial oxygen contamination, because the feed-stock for the molten material need not be small particles with their inherently high native oxide content. Thus, the molten material from which the wafers or other formed bodies are formed, has less oxygen content, and therefore, the formed bodies also have less interstitial oxygen. For instance, silicon wafers formed directly from molten semi-conductor using the methods described above typically have an interstitial oxygen content of $2 \times 10^{17}$ atoms/cc or less, as compared to at least three times that and higher for the powder based technologies. Further, such wafers have less than $8.75 \times 10^{17}$ atoms/cc (=10 ppmw) and typically less than $5.25 \times 10^{17}$ atoms/cc (=6 ppmw) total oxygen, as compared to more than $8.75 \times 10^{17}$ atoms/cc for powder based technologies.

Turning now to a discussion of different ways to increase and vary the heat extraction propensities, consideration is taken of, for example, a wafer with a relatively thicker perimeter region such as shown in FIG. 1 at 130. By controlling the heat extraction from the semi-conductor melt to the template, such that there is more heat extracted from the molten material around the perimeter, in the regions where it is desired that the wafer be thicker, as compared to the interior regions, the wafer as formed will be thicker around the perimeter than it is in the interior.

Similarly, as shown in FIG. 2 at 240a, 240b, for relatively thicker stripes or other geometries, such as shown in FIG. 8, with bus-wire landings 840a, 840b, particularly to be associated with electrical connections, relatively more heat extracted at the locations desired to be relatively thicker, will result in such relatively greater thickness at those locations, as compared to the majority of the interior region 810, where there is relatively less heat extracted.

Many different methods to provide controlled, designed, differences in heat flow and extraction in one region as compared another are discussed below, in detail. These include, but are not limited to: providing one or more regions of a functional layer, such as a coating, or a free-standing interposer layer, on the template, which retard (or in a small number of cases, enhance) heat flow, and/or extraction; providing a template that is thicker in some regions, and thus has more thermal mass and more heat extraction propensity than in other regions that are thinner, with less thermal mass and less heat extraction propensity; providing different amounts of differential pressure at different locations across the template surface; providing locally different thermal properties within the template itself, such as by including voids, effectively making the template thinner in the locations of the void; providing different degrees of porosity in the template at different locations, thereby providing different amounts of heat extraction and degrees of heat flow, either due to the porosity itself, or due to different degree of pressure differential arising from the different degrees of porosity.

To the extent that a template geometry or template treatment provides for greater heat extraction at a location where it is present than would be extracted by the template without the formation or treatment, the formation or treatment is referred to herein as a heat extraction enhancer, or a treatment that provides greater heat extraction propensity. A template treatment or formation that provides for lesser heat extraction, such as by providing a relatively thinner template section, or a plurality of voids that essentially reduce the thermal mass of the template at their location, or a coating that retards heat flow and reduces heat extraction and thus, the propensity for heat extraction, are referred to herein as a heat extraction detractor.

Thus, in a general sense, a method invention hereof is a method to produce a wafer by forming the wafer on a template that has regions of relatively greater heat extraction propensity at regions upon which will be formed regions of the wafer that it is desired to be thicker, and relatively lesser heat extraction propensity at regions of the template upon which will be formed regions of the wafer that it is desired to be thinner. A template invention hereof is a template having the relative heat extraction propensities described immediately above. The locations of greater or lesser heat extraction propensity are specifically created upon the template in locations where they are desired.

It should be noted that it is beneficial to form the wafer from the melt, and it is considered an invention disclosed herein, to create a solidified body within the melt, and to form such a body, for instance a wafer, on the template of an invention hereof. The formed body need not be released from the template to constitute a valuable article of manufacture. But also, the formed wafer can be removed from the template in a variety of ways. In some cases, the differential pressure regime can be removed, i.e., if a vacuum is used, it can be turned off, and the wafer falls off. Or, the differential pressure regime can be reduced—i.e., the degree of vacuum can be reduced, or, the difference in pressure can be reduced. Further, mechanical means can be used, either alone, or in conjunction with a reduction or removal of the differential pressure regime, such as stripping pins, a stripping frame, or other tools that mechanically contact the wafer and press it away from the mold-sheet. Any suitable means of detaching the formed wafer from the template are acceptable, and considered an invention hereof.

Some ways to extract more heat from one specifically identified region of a template as compared to another template region include, but are not limited to methods discussed in the following sections. To simplify discussion, it will be assumed initially that it is desired to have a thicker perimeter region, such as 130 at FIG. 1 and a thinner interior region 110. Thus, a thinner interior and thicker perimeter is discussed. However, it should be understood that the following discussion applies to any pattern where thicker regions are desired, such as stripes 240*a*, 240*b*, as shown in FIG. 2, bus-wire reinforcement landings 840*a*, 840*b*, as shown in FIG. 8, and/or any of the other relatively thicker regions discussed herein, as well as any other relatively thicker regions of whatever shape and for whatever purpose are designed in future structures made according to methods of inventions hereof. In such cases, the methods discussed here and below to create a thicker perimeter would be adjusted to create thicker regions where desired, other than the perimeter. (If a thinner perimeter region is desired, then the opposite operations would be taken.)

To control heat extraction, a functional layer coating may be provided on the template or on the melt surface in a pattern that defines an interior surrounded by a perimeter of the desired width of the thicker perimeter. Such a functional layer may be of the types described in the above referenced Direct Wafer technology patent, U.S. Pat. No. 8,293,009. Functional layers are discussed that provide various functions, such as: enhancing release of the solidified body from the template, decreasing nucleation sites of crystallization, increasing frequency of nucleation sites of crystallization, establishing nucleation sites for crystallization in desired locations, among other reasons. See generally at pars. 00101 and 00128-00141, of the DW Technology patent. FIGS. 32A-32E and FIGS. 33A-33H of the DW Technology patent show two different embodiments of methods using a functional layer that is applied to a melt surface.

Of particular interest for inventions disclosed herein is a functional layer coating on the template, of a type that impedes heat flow, such that less heat is extracted from the melt in the region of the template that is provided with a functional layer. (Thus, such a functional layer is typically a heat extraction detractor and its presence creates a region of a template with relatively lower heat extraction propensity, as compared to a region that has no or thinner functional material of the same heat extraction propensity, present.) Functional layers may be provided as coatings on the template, or as powder formations provided on the melt surface at the location that will be contacted by the template. Such functional materials can be deposited by methods known in the art including, but not limited to: curtain coating, spraying, slot die coating, meniscus coating and others, as well as any appropriate methods not known, but later developed or disclosed. Functional materials may also be provided as a free-standing sheet-like interposer layer that is placed between the template and the molten surface in some fashion.

A free-standing interposer layer may be adhered or otherwise secured to the template, or placed separately. Such interposer layers are to some extent free-standing forms of functional layers. Such interposer layers are described in published U.S. application Ser. No. 13/990,498, the U.S. National Phase of PCT Application no. PCT/US11/62914, filed on Dec. 1, 2011, claiming priority to provisional applications filed on Dec. 1, 2010, Published as US-Publication No. 2014-0113156-A1, on Apr. 24, 2014, entitled MAKING SEMICONDUCTOR BODIES FROM MOLTEN MATERIAL USING A FREE-STANDING INTERPOSER SHEET, the full disclosure of which is fully incorporated herein by reference, and which is referred to herein as the Interposer layer technology patent application.

Figure 12A:
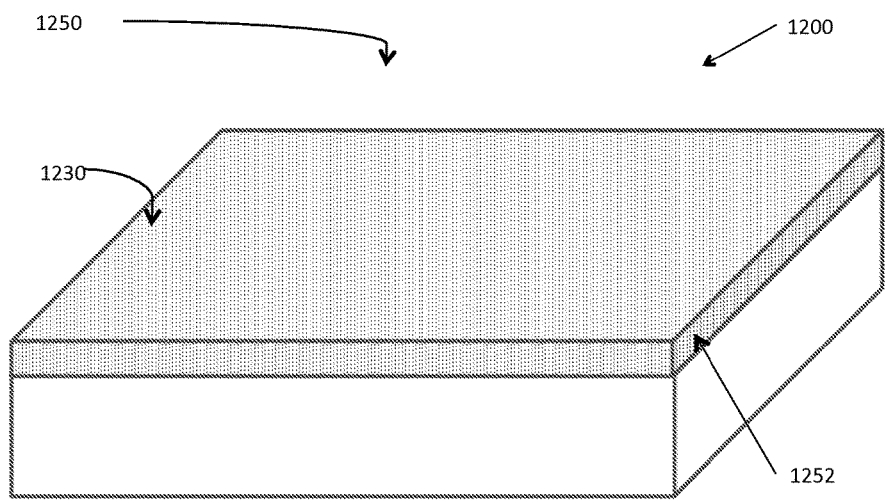
Figure 12B:
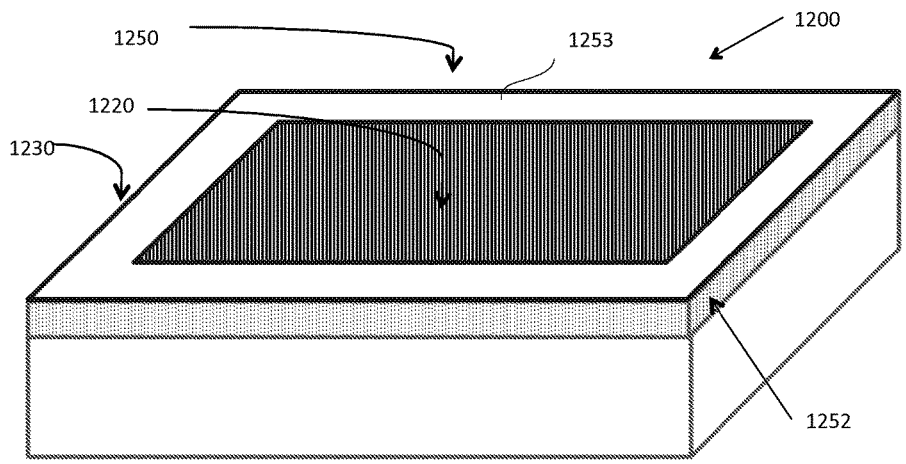
Figure 12C:
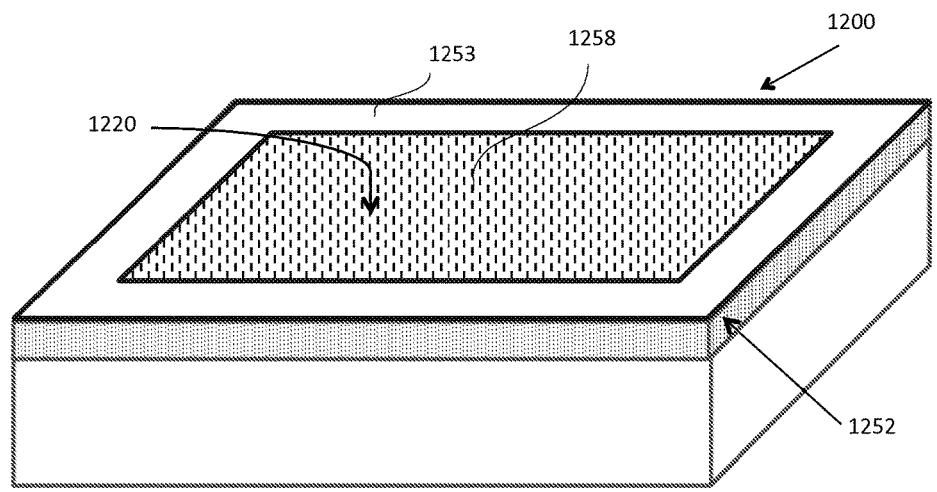
Figure 12D:
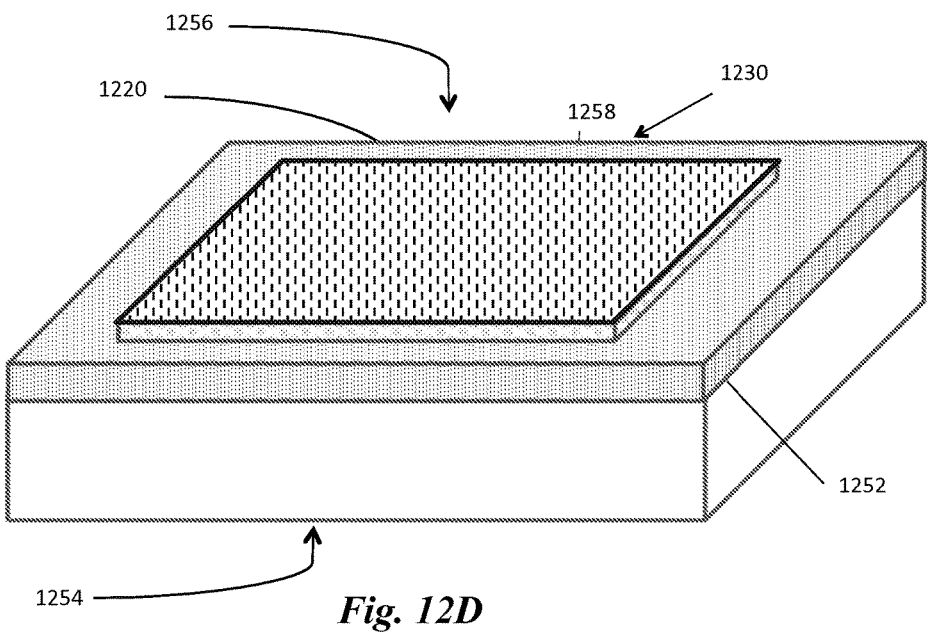

Locally establishing the thickness of, or the material of a functional layer on the template can also be used to control the thickness of portions of a wafer formed upon a template. For example, as shown schematically in FIGS. 12A, 12B, 12C and 12D, a functional layer may be deposited on a template 1200 itself, rather than on a surface of a melt. The functional layer can be deposited in two steps: as shown in FIG. 12A, a first step in which a first layer 1252 is deposited uniformly over the entire surface 1250 of a template 1200; and as shown in FIG. 12B and FIG. 12C a second step in which a mask 1253 is used to cover the perimeter 1230 of the template 1200 (which is covered entirely with the first layer 1252 of functional material). Then, as shown in FIG. 12C, an additional layer 1258 of functional material is deposited in the interior 1220 region of the template 1200. The mask 1253 is then removed, as shown in FIG. 12D, leaving functional layer covering the entire surface 1250 of the template 1200, with a deeper, thicker region of functional layer 1258 in the interior 1220, and a shallower, thinner region 1252 around the perimeter 1230. The surface 1250 as covered with the functional layers 1252 and 1258 becomes the melt-ward surface 1256 of the template 1200 as it will be used.

Figure 12E:
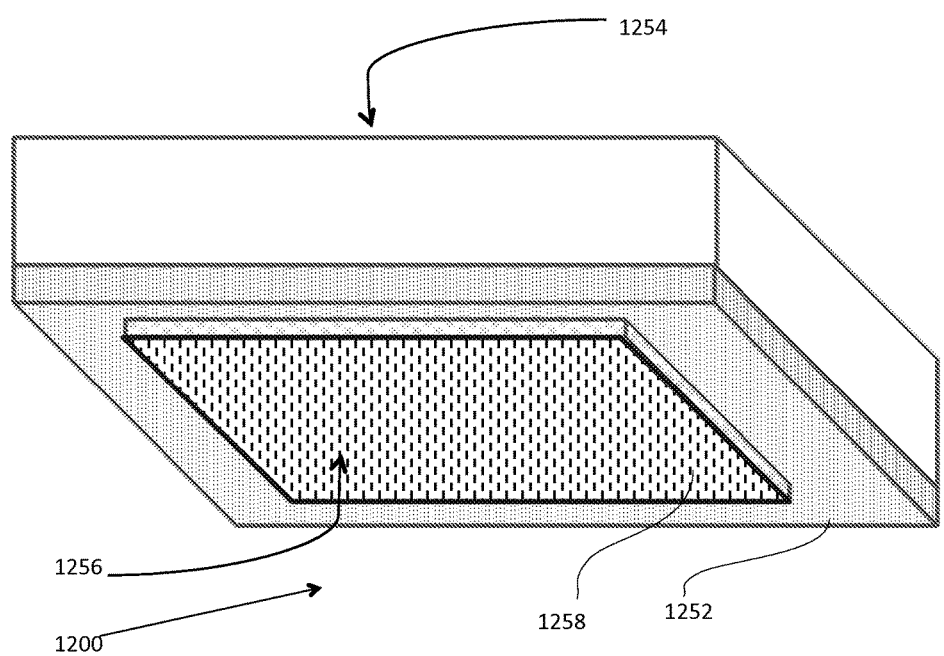

The template 1200 can then be used to form a semiconductor wafer upon it. For instance, as used, it would be flipped vertically from the orientation shown in FIGS. 12A-12D, to that as shown in FIG. 12E, so that that the melt-ward surface 1256, which constitutes the original surface 1250, covered with the thicker, two level functional layers, 1252 and 1258, faces downward, toward the molten material surface. This covered surface is then brought into contact with a surface of a volume of molten material, as described in the DW patent, for instance at Par. 0047 shown in FIGS. 3A and 3B (for embodiments without a functional layer).

The functional layers reduce the amount of heat extracted from the pool of liquid silicon, as compared to the amount that would be extracted in its absence (and thus is a heat extraction detractor). Thus, in the interior region 1220, where the functional layer 1258 is thicker than the perimeter 1230, which bears only a single functional layer 1252, a thinner portion of a wafer will form adjacent that center 1220, interior portion of the template. Thus, a wafer 100 such as shown at FIG. 1, will result, with a thinner interior region 120 and a thicker perimeter region 130.

Figure 13A:
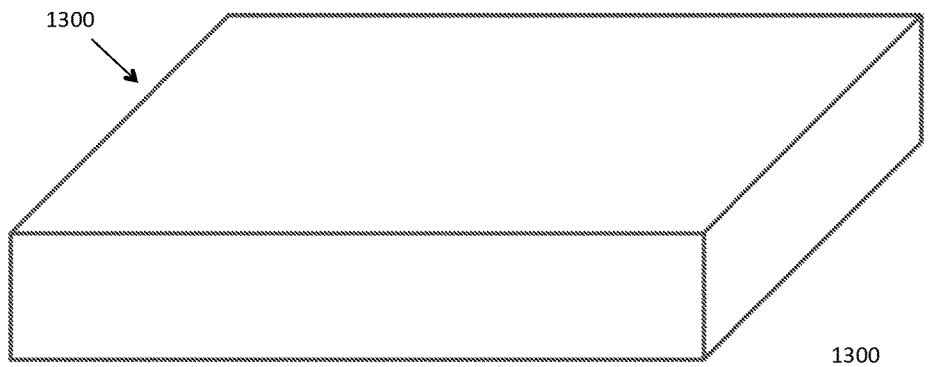
Figure 13B:
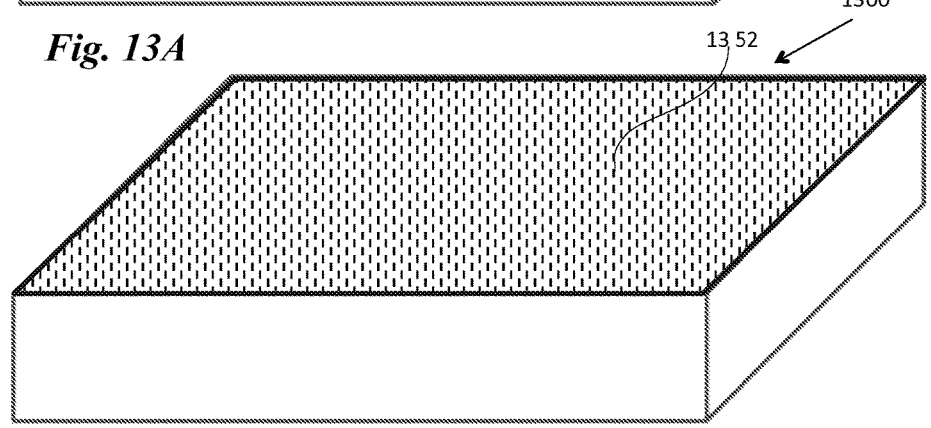
Figure 13C:
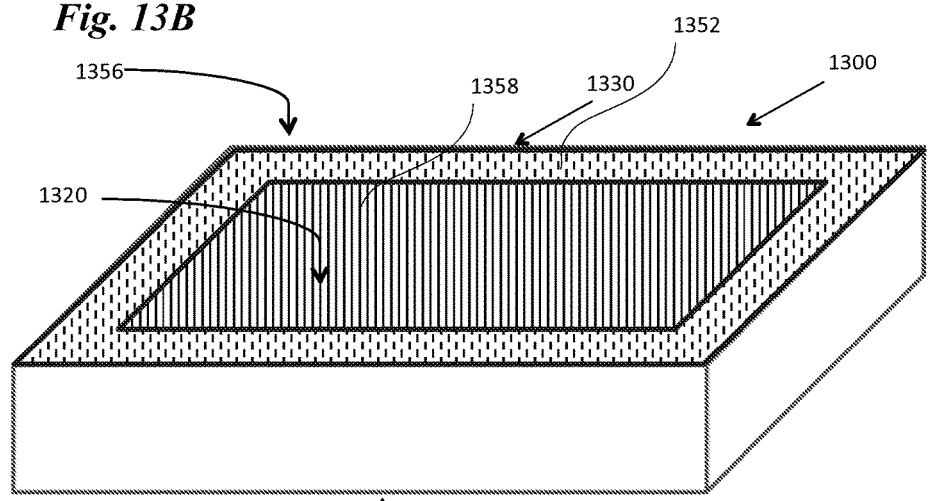

Functional layers can be applied as a powder or spray or other fluid material, as described above, or they can be applied as part of a free standing interposer layer, as described in the Interposer Layer Technology Patent application identified above. FIGS. 13A-13C show, schematically, a set up with a template 1300 (FIG. 13A) and a first interposer layer 1352 (FIG. 13B) to establish the degree of heat extraction for the entire wafer surface, and then a second, interposer layer 1358 (FIG. 13C), which is placed in the interior portion 1320 of the surface of the template 1300, so that the total thickness of the first interposer layer 1352 and the second interposer layer 1358 together in the interior region 1320 is greater (thicker) than the total thickness of the interposer layer 1352 alone around the perimeter 1330 of the template 1300.

Figure 13D:
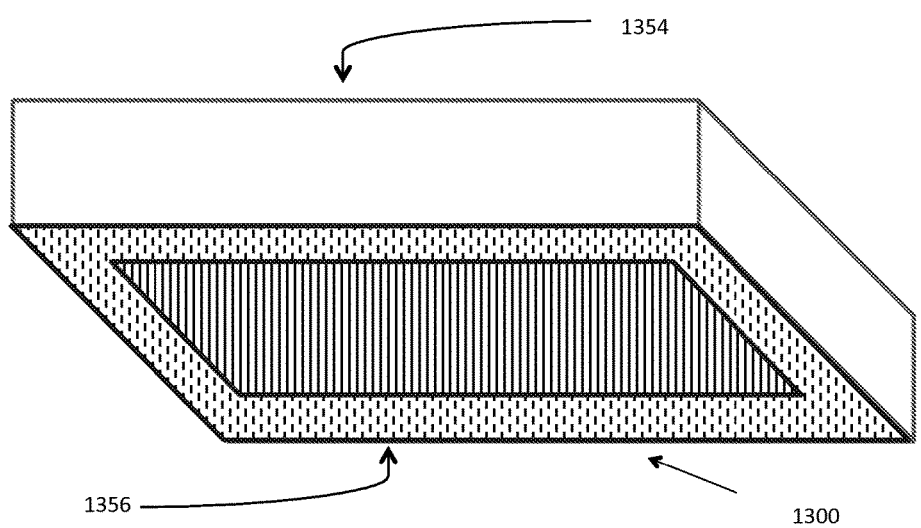

The template 1300 would be used, as shown in FIG. 13D, oriented as shown there, by flipping it over from the orientation shown in FIG. 13C, so that the functional layers 1352 and 1358 form a melt-ward surface 1356, which is brought into contact with the surface of a body of molten semiconductor material, as discussed above. The back-side 1354 of the template 1300 faces away from the molten material. The relatively thicker layer of interposer layers 1352 plus 1358 in the interior portion 1320, as compared to the single layer 1352 in the perimeter region 1330, results in less heat flow and less heat extraction in the interior 1320, as compared to around the perimeter 1330. Thus, a thinner interior region of a wafer forms upon the template 1300. The process using free-standing interposer layers is similar to that used with powder or other fluid functional layers, but with interposer layers, a mask is not required, because the interposer layer can be individually and directly placed by mechanical manipulators. No mask is required. Typically, an interposer layer is also a heat extraction detractor, which reduces the local region of the template's propensity to extract heat.

Figure 14A:
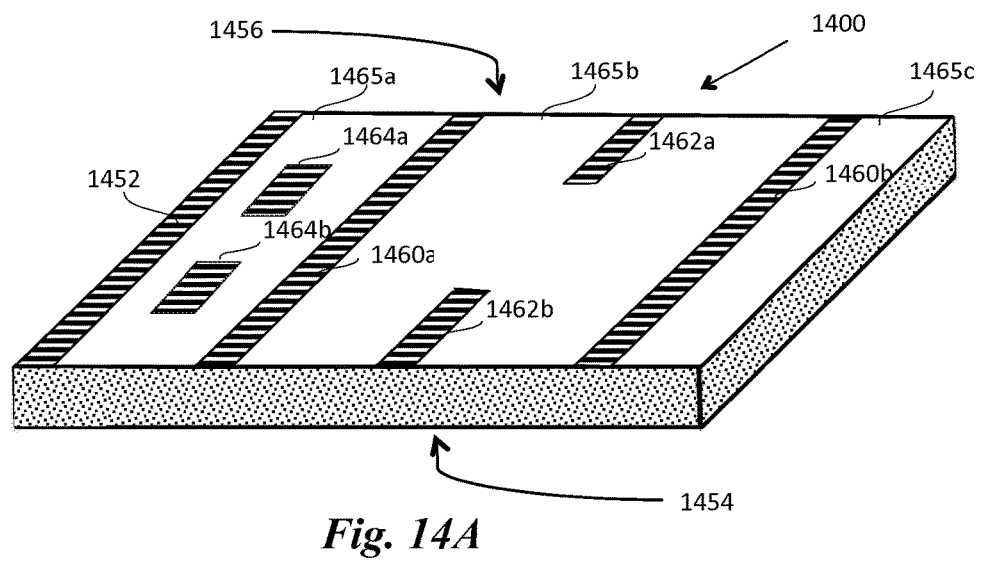
FIG. 14A shows, schematically, a template covered with strips of functional material, either as deposited in a powder or other fluid form, or as free-standing interposer bodies.
Figure 14B:
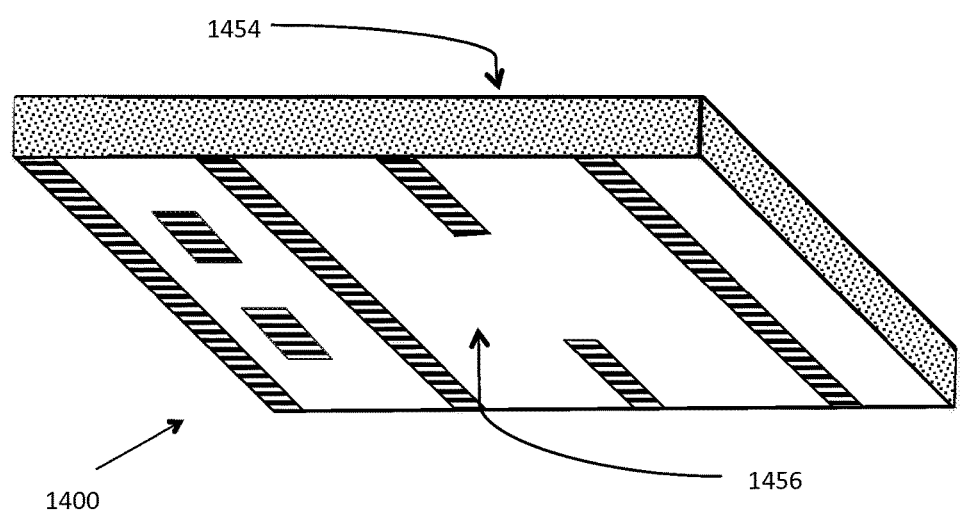
FIG. 14B showing the template of FIG. 14A, flipped so that its melt-ward side faces downward, as it would during use.

FIGS. 14A and 14B show, schematically, a set up to provide a template to produce a wafer having stripes that are thicker than the wafer interior, such as shown at FIG. 2, and FIG. 4 and thicker landings and/or islands, such as shown at FIGS. 8, 9 and/or 10. A template 1400 is provided, which has a surface 1456, which will become the melt-ward surface during use, which is covered with a first uniform layer 1452 of functional material, shown cross-hatched in FIG. 14. Seven patches of this first uniform layer 1452 of functional material are shown in FIG. 14A, as described below in more detail. By melt-ward surface, it is meant a surface that faces and then contacts the melt during wafer formation. Additional functional material is provided in the form of three irregularly shaped regions of functional material 1465a, 1465b and 1465c (shown as solid white in FIG. 14A). This results in a single layer of functional material covering template regions in the forms of stripes 1460a, 1460b, and, or landing regions 1462a, 1462b or islands 1464a, 1464b. The additional regions of functional material (thus amounting to two layers of functional material in their locations) 1465a, 1465b and 1465c, may be provided as coatings, such as through a mask of the corresponding negative shapes, or as free-standing interposer elements.

The template regions of stripes 1460a, 1460b, etc., (which are covered with only a single layer of functional material) will result in a template, that will extract less heat at the locations of the two layers of functional material, shown without cross-hatching as 1465a, 1465b and 1465c, and more heat in the regions of template that have only one layer of functional material, shown cross-hatched as at 1460a, 1460b, 1462a, 1462b and 1464a, 1464b, etc., and thus will result in a wafer formed with thicker stripes in the locations that correspond to the stripes 1460a, 1460b of one layer of functional material. Similarly, the shorter cross-hatched regions 1462a, 1462b, with only a single layer of functional material, will result in shorter, thick tabs in the shaped material where they are formed, and the islands of template surface 1464a, 1464b that are covered with only a single layer of functional material, will result in islands of thicker wafer, such as shown at FIG. 10.

FIG. 14B shows the template 1400, oriented as it would be used, with the melt-ward surface 1456 shown facing downward, so that the surface that is provided with the patterned functional layers will contact the surface of the molten material, and the back face 1454 of the template 1400 facing away from the melt.

The functional material may be provided in fluid form, such as powder or liquid, either by direct placement by a liquid or powder placement system, or by use of a mask that allows deposition of the fluid functional material everywhere, but which shields selected regions of the template surface 1454 from receiving functional material.

Considering again an embodiment as shown with reference to FIGS. 12D and 12E, typically, to effectively create a difference in heat extraction propensity, a difference in thickness of about twenty microns exists between the thickness of the functional material 1252, which covers the entire surface 1250 (FIG. 12A) of the template 1200, as compared to the total thickness of the functional material 1258 and 1252, which covers the interior 1220 of the template 1200. This thickness of twenty microns is small, but is not negligible, and it can be visually or tactilely detected in a wafer formed with a template that is provided with a functional material. (The base layer of functional material could be this thick, or more, or less. For instance, the base layer could be 40 microns thick, with the outer layer being 20 microns, for a total of 60 microns thick. Or, the functional materials could be of different materials from each other.)

Figure 15:
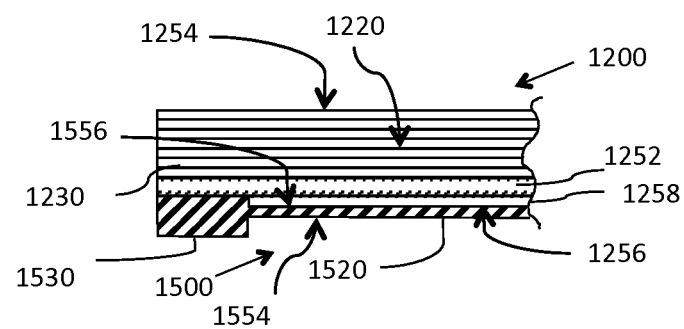
FIG. 15 shows, schematically in partial cross-section, a template with two functional material layers, and a wafer formed upon the melt-ward surface of the template.
Figure 16:
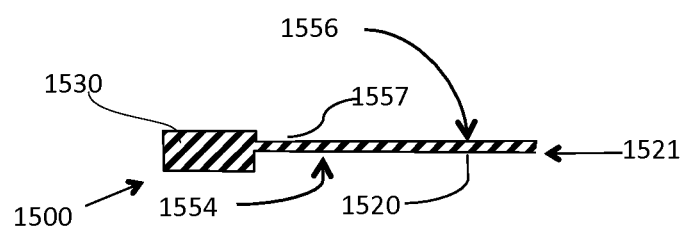
FIG. 16 shows schematically in partial cross-section, the wafer of FIG. 15, separate from the template.

This is shown schematically with reference to FIG. 15 and FIG. 16, which show a partial cross section through one portion of a wafer and a template upon which the wafer has formed (the left hand side, as shown in FIG. 12E, analogous to the left hand portions of FIGS. 1B, 5B, 6B and 7B). A wafer 1500 has been formed against a template 1200, which is essentially the same as the template 1200 shown in FIG. 12E. The template has functional material having a first, overall layer 1252 that covers the whole extent of the template 1200, and a second layer 1258 in the interior region. Thus the thickness of the functional layer in the interior is thicker. The formed wafer 1500 has a thicker perimeter section 1530, and a thinner interior section 1520. The wafer is not flat on the surface 1556 that faces the melt-ward surface 1256 of the template 1200. Rather, the template-facing surface 1556 of the wafer 1500 has a recessed section 1557 (perhaps seen best in FIG. 16), which is due to the difference in height of the combined regions of functional material in the interior 1258 and overall 1252. The overall layer 1252 is the only functional material present at the template perimeter region 1230. In a representative embodiment of a wafer of an invention hereof, this recess can be approximately 20 microns deep (in the direction of the thickness of the wafer 1500), in the case of a wafer that has an interior section 1520 that is about 100 microns thick, and a perimeter region 1530 that is between 200 and 250 microns thick.

It can be seen that the perimeter region 1530 of the grown wafer 1500 is indeed also thicker than the interior region 1520, and the perimeter extends away from a base level 1521 of the interior section. For the sizes mentioned above, the perimeter constitutes a raised portion as compared to the interior region that extends about 100-150 microns away from the base level 1521. (FIG. 16, and the other figures, are not to scale.)

A significant reason the perimeter portion 1530 is thicker than the interior portion 1520 and extends away from it is because the heat extraction propensity of the coated template 1200 is larger at the perimeter 1230 than it is in the interior 1220, because there is a lesser thickness of functional material around the perimeter 1230 (that is, there is only layer 1252 at the perimeter, but there is layer 1258 and also layer 1252 in the interior), and less restriction on the flow of heat and the amount of heat extraction, than there is in the interior section 1220. Functional material layers 1258 and 1252 may be of the same material and thermal properties, in which case the difference in thickness results in the difference in heat extraction propensity. Layers 1258 and 1252 may also be of different materials or density such that their thermal properties are different, in which case it could be that a thinner instance of a functional material of a first material would have a larger effect on heat extraction than a thicker instance of a functional material of a second, different material. This is discussed in more detail below, in the context of the discussion of other types of templates and other methods of varying heat extraction propensity across the surface of the template.

The presence of a small recess due to the slightly thicker region of functional material in regions where it is desired that the grown wafer be relatively thicker, such as shown at 1557, would be present whether the functional material is provided as a coating, such as of fluid material (either liquid or particles) or as a free-standing interposer sheet. It would also be present in the case of other wafer geometries, such as those constituting thicker stripes, landings and islands, as shown with reference to FIG. 10 (for a wafer) and FIGS. 14A and 14B (showing a template).

Template with Specifically Designed Regions of Varying Thickness

Figure 17:
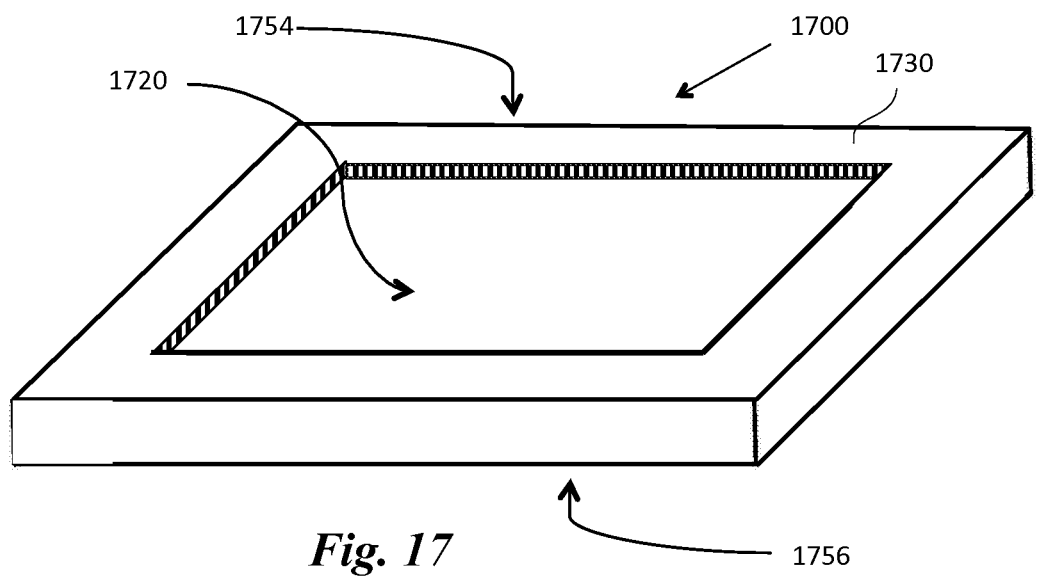
FIG. 17 shows, schematically, a template having different thickness at different regions, with a thinner interior region and a thicker perimeter region.

As shown schematically with reference to FIG. 17, a template 1700 with varying thickness over its surface area can also be provided to produce wafers with different thicknesses at specifically designed and controlled different locations of the wafer surface area. Such a template has a melt-ward surface 1756 and a back surface 1754. By melt-ward surface, it is meant a surface that faces and then contacts the melt during wafer formation. Typically, when the melt-ward surface 1756 of the template 1700 first contacts the melt, the template surface 1754 is at a temperature below that of the solidification temperature of the silicon. Heat is extracted from the melt by conduction (through any functional layers that are present, as discussed above and) into the template 1700. The template heats up and this limits the thickness of the wafer that is created upon it. This is because, when the template heats up to the melting temperature of the semi-conductor, material can no longer solidify against the template at locations that have been raised to the melting temperature. The thicker a region of the template, the longer it takes the region to heat up to this temperature, and the thicker the wafer material that solidifies against the template at the thicker regions, as compared to at the thinner template regions. Thus, a thicker region of template has more heat extraction potential/propensity than a thinner region. Thus, a thicker template region is a heat extraction enhancer, and a thinner template region is a heat extraction detractor.

Figure 1A:
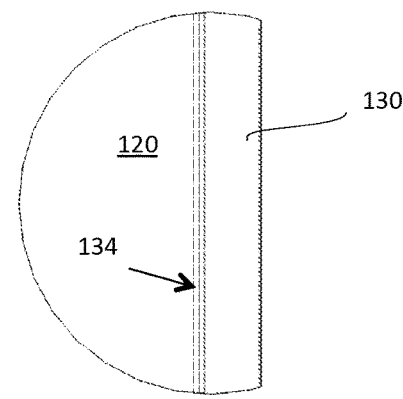
FIG. 1A is an enlarged view of a perimeter region of the wafer of FIG. 1 at A.
Figure 1B:
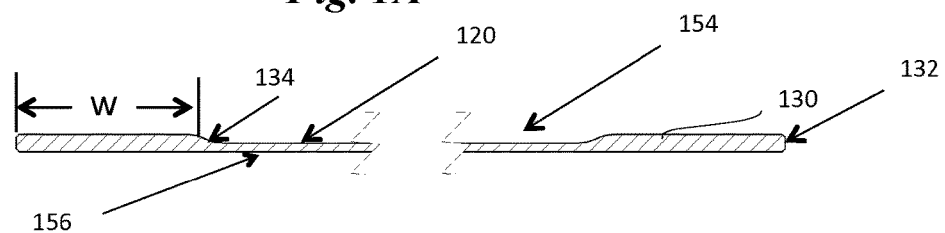
FIG. 1B is a cross-sectional view of the wafer of FIG. 1 along lines B-B, showing that the perimeter is thicker than the interior region.

Thus, in another embodiment of a method invention hereof, shown schematically with reference to FIG. 17, the thickness of the template 1700 itself can be different from one region of the template, for instance an interior region 1720, to another region, for instance, a perimeter region 1730. If there is relatively less thermal mass in the template 1700, for example, by making certain regions, such as the interior region 1720 locally thinner than other regions, such as the perimeter region 1730, there will be less thermal mass, less heat extraction, and the interior 1720 of the template 1700 will heat up to the melting temperature relatively quickly, as compared to thicker perimeter regions 1730, and thus, at the thinner regions of the template 1720, less silicon will be solidified, resulting in a locally thinner wafer, for example, in its interior region, as shown with reference to the wafer 100 in FIG. 1 and FIG. 1A.

It should be noted that it is non-obvious, counter-intuitive and novel, that the template 1700 will form a wafer such as shown at 100 of FIG. 1, having a thick perimeter 130 and a thinner interior 110, by contacting the template's substantially planar, melt-ward surface 1756 to the melt surface. As shown schematically with reference to FIG. 18, which shows, in cross-section, a portion of a wafer 100, such as shown in FIG. 1, grown upon a mold 1700 as shown in FIG. 17, the wafer 100 grows away from the melt-ward surface 1756 of the template 1700, into the melt. But, because of the different heat extraction propensities of the interior portion 1720 and perimeter portion 1730 of the template 1700, due to the different thicknesses thereof, as seen from the back surface 1754, the grown wafer 100 will have a thickness that qualitatively (but not quantitatively) mirrors that of the template 1700, with a thick perimeter 130 and a thin interior 120. (The degree of differences in thicknesses of the thin and thick portions of the template and the wafer will be different from each other, and FIG. 18 is schematic only, and is not to scale.)

The non-planar surface 154 of the formed wafer 100 (facing the viewer in FIG. 1, shown in FIG. 1A) will grow, growing and facing away from the melt-ward surface 1756 of the template. Thus, the substantially planar surface 156 of the formed wafer 100 forms upon and is mated to the substantially planar melt-ward surface 1756 of the template 1700, while the non-planar faces of each the wafer 100 (face 154) and the template 1700 (back face 1754) face away from each other.

(It should also be noted that in practice the template would stop extracting enough heat to continue wafer growth somewhat before the template temperature reaches the melting point of silicon. The template has a relatively small thermal capacity compared to the molten silicon and crucible, which are generally at the temperature of molten silicon, or higher, and the template only cools the melt locally. As the template heats up, the rate of heat extraction lessens and will eventually be lower than what is required to outweigh the influx of heat from the rest of the melt, to cool a local layer of molten material to below the melting point and overcome the heat of fusion.)

Figure 18:
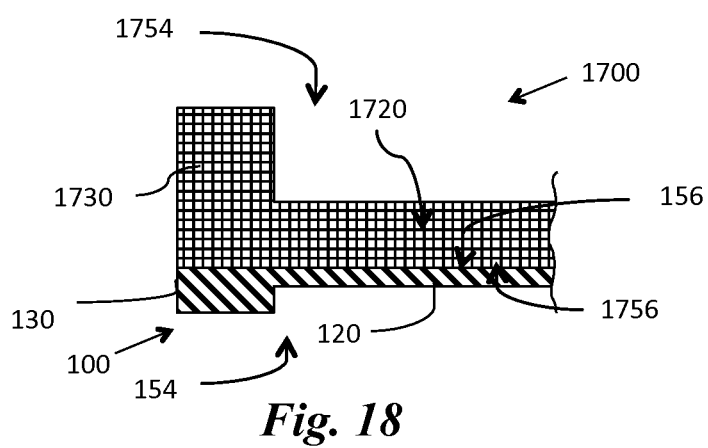
FIG. 18 shows, schematically in partial cross-section, a template with varying thickness, and a wafer formed upon the melt-ward surface of the template.

It should be noted that for both of a template that operates with portions treated with functional material, such as the template 1200 shown at FIG. 15, and a template that operates with portions of different thicknesses, such as the template 1700, shown at FIGS. 17 and 18, the meltward surface, surfaces 1256 and 1756, respectively, is substantially flat, yet the wafers grow with their non-flat surfaces, 1554 and 1754, respectively, facing away from the controlling respective templates.

It is also possible to provide a template having different thicknesses in different regions that correspond to the other wafer geometries set forth above. For instance as shown schematically in FIG. 19, it is possible to provide a template 1900 that has a generally planar melt-ward face 1956, (not visible in FIG. 19) and a back face 1954 and an overall interior region 1920 that is relatively thin. The thin region 1920 establishes a base level, from which extend raised portions, or protrusions, such that the thickness of the template at the locations of the protrusions is thicker than a base level, thinner portion 1920. The protrusions can be in the shapes and the locations of a perimeter 1930, one or more of: a stripe 1960, a landing or tab 1940, and an island 1942, etc., as discussed above. The back face 1954 of such a template would be non-planar, and the template would have heat extraction propensities that are greater at the specifically designed locations 1930, 1940, 1942, 1960, where the template is thicker. Thus, the wafer formed upon such a template would have thicker regions at corresponding locations to the raised protrusions, in a similar manner to the thicker perimeter 130 of wafer 100 has, when grown upon the template 1700 with the thicker perimeter 1730. The thicker portions of the wafer grow into the melt.

In general, a small area on a template that is thick will have greater surface area to volume ratio, than does a larger area of a template, so there will be relatively more blurring of the heat extraction potential at the perimeter. For example, for to achieve a perimeter 200 microns thick and also to achieve a 200 um thick small island, which would have a greater surface to volume ratio than the perimeter, a designer would likely need to make the region of template that will establish the island thicker than the region of template that will establish the perimeter (or any region that is bigger and has less surface area for heat loss per volume of bulk thermal capacity).

Figure 19:
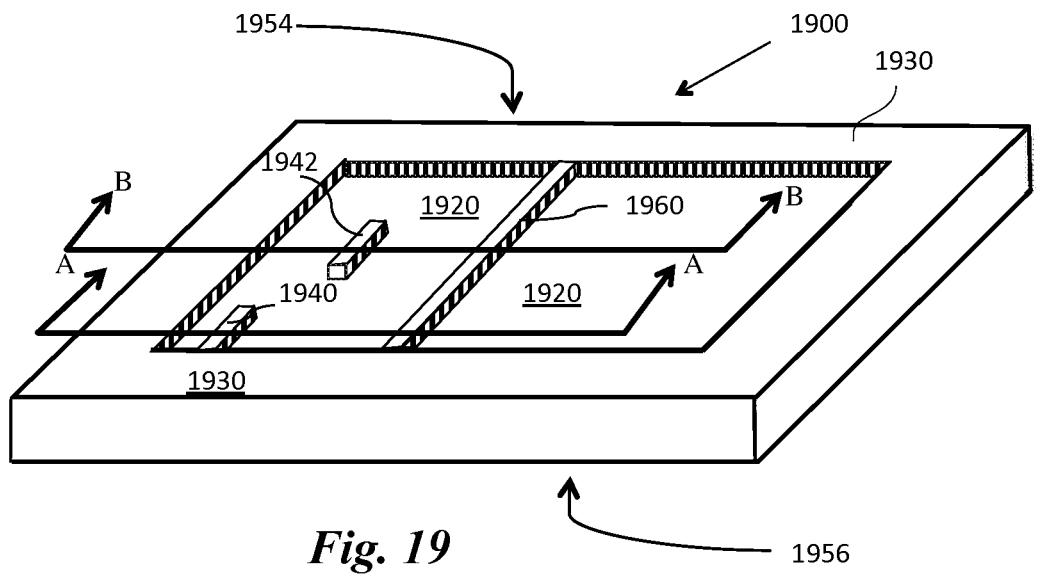
FIG. 19 shows, schematically, a template having different thickness at different regions, such as at FIG. 17, with a thinner interior region and a thicker perimeter region, and also with thicker interior regions for forming a stripe, a landing and an island.
Figure 19A:
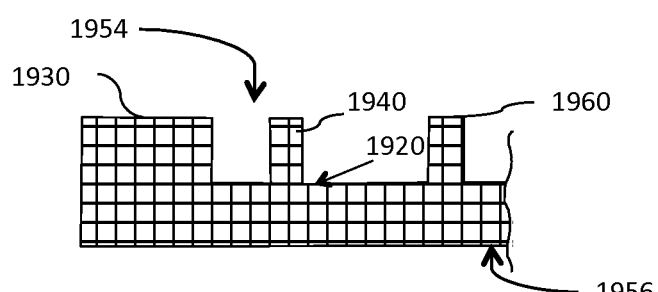
FIG. 19A shows, schematically, in cross-section, the template of FIG. 19 along lines A-A.

FIG. 19A shows the template 1900 of FIG. 19, cut at the section A-A, showing the thinner interior region 1920, the thicker perimeter region 1930, which will cause growth of a thicker perimeter region 130 in a wafer 100, as shown at FIG. 1, or as shown at FIG. 10, the perimeter 1030. Also shown in FIG. 19, is a thicker region 1940 of the template, which would give rise to a thicker landing or tab, such as 1040a, 1040b, as shown in FIG. 10, and also a thicker region 1960 of the template, which would give rise to a thicker stripe, such as 240a, 240b, as shown in FIG. 2.

Figure 19B:
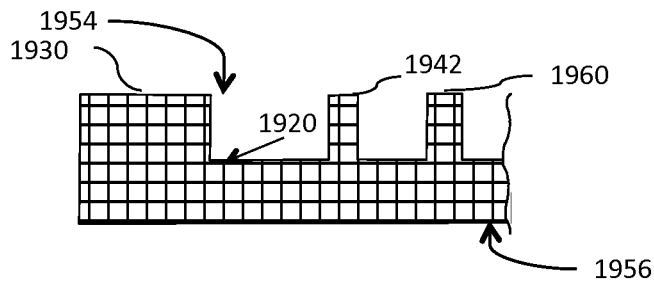
FIG. 19B shows, schematically, in cross-section, the template of FIG. 19 along lines B-B.

FIG. 19B shows the template 1900 of FIG. 19, cut at the section B-B, showing, as above, the thinner interior region 1920, the thicker perimeter region 1930 and a thicker region 1950, which would give rise to a thicker stripe. Between the thicker perimeter region 1930 and the thicker stripe region 1960, is a thicker region 1942, which would cause growth of a thicker island, such as shown at 1042a, 1042b at FIG. 10.

Figure 20A:
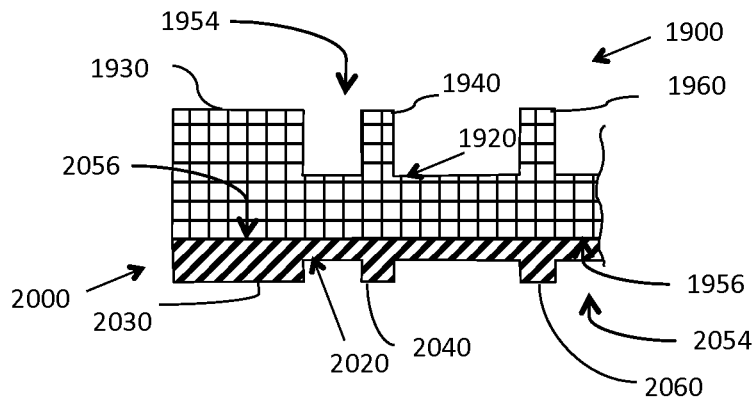
FIG. 20A shows, schematically, in partial cross-section, the portion of the template with varying thickness, shown in FIG. 19A, with a wafer formed upon the melt-ward surface of the template.
Figure 20B:
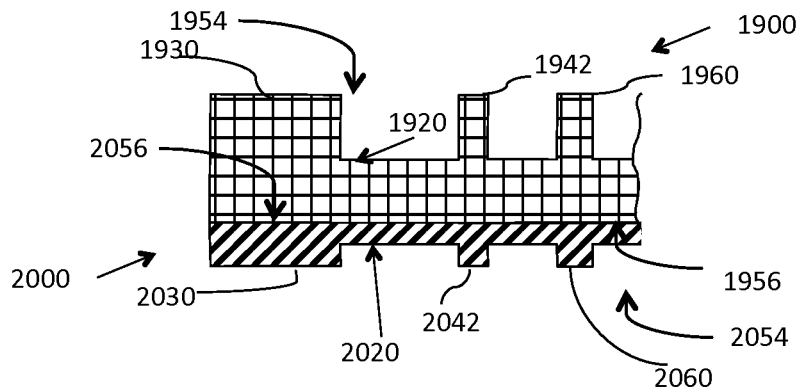
FIG. 20B shows, schematically, in partial cross-section, the portion of the template with varying thickness, shown in FIG. 19B, with a wafer formed upon the melt-ward surface of the template.

FIG. 20A shows, in cross-section, the same portion of the template 1900 of FIG. 19A, associated with a cross-section of a portion of a wafer 2000, which would be grown upon the template 1900, showing the thicker perimeter region 2030 matched with the thicker template region 1930, the thicker tab or landing region 2040 of the wafer and the thicker stripe region 2060. FIG. 20B shows the portion of the template 1900 of FIG. 19B, associated with a cross-section of a portion of the same wafer 2000, which would be grown upon the template 1900, showing also the thicker perimeter region 2030 and thicker stripe region 2060, and also a thicker island region 2042. As with the simpler template and wafer pair shown schematically with reference to FIG. 18, it can be seen that, the relatively thicker regions of the grown wafer grow away from the template, into the melt, such that the wafer grows in a qualitatively mirror-like configuration as compared to the template. (By qualitatively, it is meant that the thicker and thinner regions are adjacent/mirroring each other, but they are not quantitatively mirroring-meaning that their lateral extent along the wafer matches and are essentially equal in size-extent, but their projections away from each other are not equal in size.)

Templates with such a base level and protrusions can be manufactured in any suitable means, such as by conventional machining, with milling, drilling, sawing operations. For instance, one method is to machine a thin sheet of material by securing it using a vacuum chuck, while conventionally milling a pocket in the region of the template that is to have a reduced thickness. Laser machining is another alternative method that alleviates fixture requirements by, avoiding cutting forces.

Another means of varying the thickness of the formed wafer relates to application of a different degree of a differential pressure applied during wafer formation. The Direct Wafer technology patent discusses providing a pressure differential across the mold face, as compared to a region at the melt surface, which pressure differential is typically a vacuum at the mold face, as compared to atmospheric pressure at the melt surface. It has been determined that having a relatively larger pressure differential in one region of the template, such as a perimeter region, as compared to the pressure differential in another region of the template, such as the interior region, will result in more heat flow and more heat extraction there at the locations of larger pressure differential. It is believed that this is because the higher vacuum level results in a higher rate of heat transfer to the template, thereby solidifying silicon faster and to a thicker maximum amount.

In fact, it has been determined that regions of larger pressure differential have a greater heat extraction propensity, and further, it has been determined that regions of wafer formed against such template regions of greater pressure differential are relatively thicker than regions of wafer grown adjacent or facing regions of lesser pressure differential. In the terms discussed above, a greater pressure differential is a heat extraction enhancer, and a lesser pressure differential is a heat extraction detractor. Thus, it is an invention hereof to provide differing levels of differential pressure arranged according to specifically designed locations where it is desired to have different thicknesses in the formed wafer.

The Direct Wafer technology patent discusses ways to provide relatively greater pressure differential (such as a stronger vacuum) in one location as compared to another. One way to do this, shown at FIG. 27 of the DW technology patent and discussed at par. 00160, 00163 therein, is to provide a dual plenum, with a first, interior region which is kept at a first pressure, and a second, perimeter region plenum which is provided with a different pressure differential. Thus, greater pressure differential may be provided in the perimeter region, which greater pressure differential would also enhance the heat flow, thus extracting more heat from the melt in the perimeter region, thereby resulting in a thicker wafer in the perimeter region. (The reason for having a dual plenum mold discussed in the DW patent is totally different from, and would be used in a different manner from, a reason to establish different differential pressure regimes around the perimeter as opposed to the interior, to create a thinner interior. One reason for a dual plenum device discussed in connection with FIG. 27 at par. 00114, is to aid in removing a wafer from the forming surface after it has been formed, by preventing wafer formation near the relatively sharp, retentive edges of a mold. Another reason, discussed in par. 00118 of the DW technology patent, is to aid in securing the mold sheet itself to the vacuum plenum assembly.)

Another method to vary the thickness of the wafer being formed is to vary the degree of differential pressure applied, by provided functional material, such as coatings, having different degrees of permeability at one region of the template, as compared to another. Such a structure is discussed in the DW technology patent at par. 00118, discussing a non-permeable coating 2712 on the back-side of the mold sheet 2705 in the area where vacuum is not desired. Examples of such coatings are CVD SiN (Silicon Nitride) or pyrolytic graphite. All functional material layers, such as are discussed above, are permeable to some extent, but functional materials with different degrees of permeability but with otherwise similar properties (thickness, thermal mass, thermal conductivity, etc.) could be used to create different thickness. In the terms discussed above, a functional material layer with a greater permeability, which could lead to a greater pressure differential, is a heat extraction enhancer, and a lesser permeability, which could lead to a lesser pressure differential, is a heat extraction detractor. It is, however, expected to be a relatively less influential property of a functional material, such as a coating, in regard to thickness of wafer.

In another embodiment of method inventions hereof, the temperature of the template may be locally varied during a preheating phase before contacting it to the melt. In regions where the temperature of the template is lower (cooler), a greater thickness of silicon will be frozen, resulting in a thicker region. Thus, to achieve a thicker perimeter region of a wafer, the perimeter of the template would be kept at a lower temperature than the interior of the template. (Or, stated differently, to achieve such a thicker perimeter region, the interior of the template could be heated or kept at a higher temperature than the perimeter region of the template.) In the terms discussed above, a lower temperature region of a template is a heat extraction enhancer, and a higher temperature region of a template is a heat extraction detractor. In general, template temperature is an important mechanism for thickness control. However, on a local enough basis to create the structures discussed herein, it is believed that other techniques discussed herein are more practical and cost effective. However, to the extent that the considerations of cost and effect weigh on the balance of template temperature adjustment, such could be achieved by conventional means, such as shaped heating elements, heat shields or local cooling. The effect of thickening at the perimeter of the wafer may be more gradual in the case of this method of locally varying heat extraction propensity, resulting in a smoother transition between the thicker perimeter and the thinner interior region. Even with a relatively wide, e.g., 10 mm border region of increased thickness, 76% of the central interior area of the wafer would be relatively thinner and still provide the benefits of lower silicon usage and higher efficiency.

Figure 21:
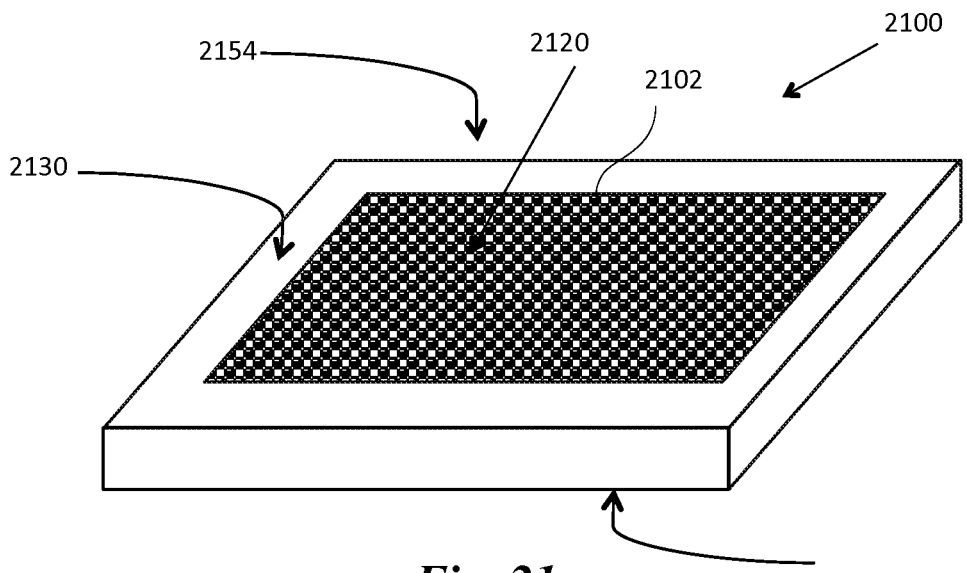
FIG. 21 shows a template with holes arranged within the interior, to provide a template with differing thermal properties in its interior region, as compared to its perimeter region, with the holes shown schematically, to simplify illustration.

Another method to extract more heat from the perimeter region, and thus to provide a wafer having a thicker perimeter region, is shown with reference to FIG. 21. This is to provide different thermal properties for the perimeter region of the template, than for its interior, typically by providing holes, either in the interior or the perimeter or both, with the holes being either empty or partially filled, or a combination thereof.

One way to provide different thermal properties for one region of a mold, as compared to another, is described in the Direct Wafer technology patent at paragraphs 00103-00104. (That method is not aimed at producing wafers having regions of different thicknesses, nor was that possibility contemplated or discussed. It is aimed at effecting in-plane lateral propagation of the solid-liquid interface, without the need for a dynamically stable meniscus. This is done by spatially varying the rate of heat transfer into the mold sheet by varying the properties and geometry of the mold.)

FIG. 20 of the DW patent shows spaced apart voids 2016 (reference numerals in this paragraph refer to the DW patent figures) within the body 2005 of the mold sheet, such that portions of the mold sheet (at the voids 2016) are essentially thinner than other portions of the mold (those locations 2004 between the voids). The portions at the voids are essentially thinner than the other regions between the voids.

Regarding the present inventions, as shown schematically with reference to FIG. 21 of the present application, it is possible to use a template 2100, provided with a field of holes 2102 located within its interior 2120 but not around its perimeter 2130. In general, the holes can be quite small in diameter, and can be spaced quite closely together. The holes could, for instance, have a center-center spacing on the order of the thickness of the template or smaller. For example, in a 1 mm thick graphite template (from melt-ward surface to back surface), the holes could be 0.5 mm in diameter, 0.6 mm deep, on a spacing of 1 mm. Hexagonal spacing arrangement is typically preferred, but a square arrangement also is beneficial. The diameter of the holes is similarly on the order of the thickness of the template, or smaller. The depth of the holes can be any size that provides effective change in heat extraction propensity, which would typically mean at least half the thickness of the template, and, the upper limit is the entire thickness of the template.

The holes can be blind, meaning passing only partially through the template thickness, with their open end typically at the back face 2154 of the template 2100, which faces away from the molten material. The melt-ward face 2156 faces the molten material, and, at least with regard to any holes there-through, is generally smooth (i.e., not pierced by any holes.) Or the holes could pass all the way through the template body from the back surface 2154 to the melt-ward surface 2156. Or, the holes could be fabricated by first establishing blind holes with their open end at the back face of the template, and then plugging that back face, so that there is a void region trapped between two filled or solid regions, for at least some of the holes.

If the holes are blind, and empty, with their intact, closed ends on the melt-ward surface 2156, facing the molten material, and their open ends on the back surface 2154, facing away from the molten material, and they are left empty, they effectively create thinner template regions at their locations, which will result in less heat extraction from the melt at those locations, resulting in thinner wafers bodies adjacent those locations. Thus, if the holes are left empty, and are close enough together, and small enough for heat extraction purposes, to essentially create a continuous region of thinner template within the interior, the template would effectively be thinner in its interior (analogous to the interior region 1720 of the mold 1700 shown in FIG. 17) and a wafer formed with a template provided with a field of empty, blind holes within its interior, would have a thinner interior region, such as is desired, and shown schematically at FIG. 1.

Thus, providing voids, or holes is an alternative way to make regions of the template relatively thinner than others. Thus, a plurality of voids in a template region, results in a thinner template region and thus constitutes a heat extraction detractor. Using holes, as opposed to a continuous thinner region, such as at 1720 of FIG. 17, may result in a template having lower thermal mass, thereby resulting in lower heat extraction but with more mechanical strength, than the continuously thinner form shown in FIG. 17.

The holes can be formed by known mechanical machining means. One method would be to drill the holes at desired locations. Another method would be to provide a plurality of closely spaced, parallel saw cuts with a circular saw blade, which does not pass all the way through the template, spaced apart the desired spacing of the holes. Then, a second set of parallel saw cuts could be provided, oriented perpendicularly (or at least approximately so) to the first plurality, also spaced apart the desired hole to hole spacing (also taking into account the kerf of the saw cuts). This would result in a plurality of upstanding pin-like structures at the intersections of the spaces between the saw cuts. The pins define a grid of remaining material, and the spaces between all of the pins would be analogous to holes in the surface, thereby establishing the effectively thinner interior region of the template.

Another related way to provide regions of greater relative heat extraction is to provide template regions that have more gas permeability than other regions. The regions of greater permeability will enable a stronger force of relative pressure to be applied to the forming body due to the differential pressure regime, and thus greater heat extraction due to the greater pressure differential. The pressure gradient for viscous flow through a porous material is determined by the flow rate times the viscosity divided by the gas permeability of the material. This is characterized by phenomena governed by relations known to skilled persons as Darcy's law.

One way to do this has already been discussed above, by providing functional materials that change the gas permeability of locations where they are provided, or by providing functional materials of different permeability in different locations. In some cases, providing a field of blind holes (or open holes) would establish greater gas permeability in the region where there are holes, as compared to regions without holes. Thus the regions where there are blind holes may provide enhanced heat extraction, and thus, thicker regions of formed semi-conductor upon them. Note that this effect is the opposite of the effect discussed above, in which the thinner regions constitute those of lesser thermal mass, and thus, thinner portions of wafer are formed adjacent the template regions with holes. The effects of both greater permeability and of lesser thermal mass are well defined and the person of skill in the art will be able to understand their relative magnitudes, and will thus be able to determine and design the effect desired by appropriate choice of the sizes and locations of holes. It is believed that in general, the effect on thermal mass will dominate the considerations, but the permeability effects must also be considered.

It is also possible to fill the holes with inserts of a material whose thermal properties are such that more heat is extracted in their vicinity than from the non-augmented regions of the template. Thus, perimeter holes could be filled with such material, that is more thermally massive than the major portion of the template, so that the perimeter of the wafer formed will be thicker, as desired, and as shown with reference to FIG. 1. However, methods of inserting materials into such holes are somewhat challenging.

When choosing materials for the template, and any template inserts, and also when considering whether to leave holes in the template empty, or how large (deep, diameter) to make them, the designer should consider that both thermal conductivity and thermal inertia (heat capacity) can influence solidification thickness. This is analogous to the discussion earlier, in that the heat transfer determining thickness has a transient aspect (thermal conductivity) and a steady state aspect (thermal inertia)—due to the fact that there is competition between the heat being pulled up into the template and the heat being conducted into the wafer from the melt below.

A template can be used that has inserts arranged in different patterns, to produce other wafer geometries as discussed above. The holes can be left empty, to provide essentially thinner regions of template at the empty hole locations, or they can be filled with material having thermal properties to provide heat extraction enhancement or detraction as compared to the major body of the template, thus giving rise to either thicker or thinner regions of wafer in their locations.

In the foregoing discussion, thin wafers with thicker perimeter regions have been discussed. The perimeters have been shown fully surrounding the interior region, for instance on four sides, as shown in FIG. 1. It is also possible that less than the entire perimeter be thicker than the interior region. For instance, one, two or three border edges (referred to as a border, herein) could be thicker. Or, rather than an entire border region being thicker, the thicker regions could constitute portions of a single border.

Further, the above discussion focuses on industry standard, square wafers. This is the most common practice today, but the inventions disclosed herein are applicable to wafers having any shape, including non-square rectangles, circles, triangles, etc. What matters is that there be a generally thin region and at least one thicker region in at least one specifically designed location, the thicknesses being measured in the direction that is orthogonal to the surface (square, rectangular, circular, etc.) of the wafer. A recent (in the year 2015) industry trend is to fully process 156 mm square silicon wafers into 156 mm square solar cells, taking advantage of the supply chain infrastructure and standardized equipment for handling this size, but cutting them to 156 mm×78 mm half cells immediately before tabbing, stringing and encapsulation into a module. This builds higher voltage at lower current and minimizes series resistance losses. To support this option using wafers disclosed herein with local thickness control, a center ridge can be provided along a line that will become the cut line for making half-cells. The ridge would be similar to a stripe 240*b*, as shown at FIG. 2. The wafer could then be sliced along the center-line of this ridge/stripe, which would then become a portion of the thickened perimeters of the two half-size cells that are formed.

In general, wafers of inventions hereof will have a relatively thinner portion and a relatively thicker portion. In a preferred embodiment, the relatively thinner portion extends over at least 80% of the surface area of the wafer, and preferably over at least 90%. This is to balance the additional effort and cost to produce a more complicated wafer with the benefits of material cost and efficiency gained from the thinness and the materials savings. In general, the thinner portion in an absolute would be at least 50 microns thick, and, to achieve the efficiency gains, at least 80 microns thick. The ratio of the thickness of the thicker portion to that of the thinner portion is typically at least 1.28:1 (for instance 180 microns perimeter with 140 microns interior) and can be as much as about 3:1 or 5:1.

General considerations are that efficiency of the thinner portion is achieved at any size down to about 80 microns depending on the specific cell structure used. Standard thickness wafers are 180-200 microns, and thus, thicker portions within this thickness range would be a useful embodiment. Similarly, the thicker portion could be as much as 250 microns thick for added strength, and still being within a relatively standard size range. Thus, one might readily fabricate a wafer with a thin portion as thin as 80 microns, and a thicker portion as thick as 200 and even as thick as 250 microns. Such a wafer would have a thickness ratio of slightly more than 3:1, with a thicker portion that would extend 170 microns above the base level of the thinner portion. It is conceivable that utility could be had with an ultra-thin interior of about 50 microns, for weight savings purposes, and a relatively thick perimeter of 250 microns, which is at the outer limit of contemporary usage. Such a wafer would have a thick to thin ratio of 5:1.

It should also be noted that the foregoing ratios of thick and thin regions are presented in the context of industry standard 156 mm×156 mm silicon wafers, or perhaps wafers of half of that size. The size considerations above have been developed in consideration of machinery and processes currently used for such wafers. However, for applications other than PV, or other than for these standard sizes of wafers, bodies of either larger or smaller sizes in area can also be made by use of the Direct Wafer making technology patent methods, such as much smaller, or somewhat larger in either length or width or both dimensions. For such non-standard size bodies, the ratios of thick to thin may be more frequently at the limits of the range mentioned above of 1.28:1 to 5:1. Similarly, there may be more frequent applications of very thin wafers near to the 50 micron size, or wafers with thick portions, such as near to 250 microns.

It should be noted that many/any of the foregoing techniques to provide a template with different heat extraction propensities at different locations can be used with any others. For instance, a template that has varying thicknesses in different locations, either with somewhat uniform density, such as shown at FIG. 17, or, with voids, creating an effectively thinner or more permeable template region at their locations, can be used with each other and also with the application of functional layers, either as coatings or as interposer layers. Any of the various shapes of thicker regions shown in the template and wafer geometries can be used with any other shapes. Any templates discussed above can have heated or cooled regions or other specifically local template temperature control or enhancement. Further any of the template geometries discussed can be used with multiple differential pressure regimes of differing, greater and lesser degrees, either established with more than one plenum, or coatings of different permeability, or different porosities of different regions of the template.

The grown wafer can be provided with regions of raised portions on both faces of the grown wafer—that is, the surface that grew facing the template, and the surface that grew facing the melt, by providing functional layers such as shown In FIG. 15, which produces a wafer 1500, as shown in FIG. 16, with raised portions extending from both surfaces of the wafer. It is possible to provide the functional layers with significantly different thickness (for instance greater than 20 microns), such that the jog 1557 in wafer thickness is significantly large, as compared to the thickness of the perimeter 1530 or other thicker regions. Or, functional layers can be provided to establish a difference in the height of raised portions on the surface that faces the template, and differences in template thickness, or pressure differential, etc. could be used to provide the height of raised portions on the melt-ward surface.

This disclosure describes and discloses more than one invention. The inventions are set forth in the claims of this and related documents, not only as filed, but also as developed during prosecution of any patent application based on this disclosure. The inventors intend to claim all of the various inventions to the limits permitted by the prior art, as it is subsequently determined to be. No feature described herein is essential to each invention disclosed herein. Thus, the inventors intend that no features described herein, but not claimed in any particular claim of any patent based on this disclosure, should be incorporated into any such claim.

For instance, the invention of using functional materials to control heat extraction may be used as discussed alone, or in combination with any of the other methods, such as using templates of differing local thicknesses, applying different degrees of differential pressure, different degrees of porosity, different local template temperatures, and different degrees of gas permeability. Similarly, using templates of differing local thicknesses can be used with any of the other techniques just mentioned. Any of the geometries may be used alone, or with any of the other geometries, or with any other reasonable geometries not mentioned. Thick perimeters can be used with any or all of islands, landings, stripes, full or partial borders, and any of these can be used with any or all of the others.

The inventions have been described primarily with silicon semi-conductors for photovoltaic use. However, the techniques can be used with any semiconductor, for whatever use. PV wafers have been used as a representative article to be manufactured, however other semiconductor bodies with different sorts of electrical connections can also be made using the disclosed template based methods.

Some assemblies of hardware, or groups of steps, are referred to herein as an invention. However, this is not an admission that any such assemblies or groups are necessarily patentably distinct inventions, particularly as contemplated by laws and regulations regarding the number of inventions that will be examined in one patent application, or unity of invention. It is intended to be a short way of saying an embodiment of an invention.

An abstract is submitted herewith. It is emphasized that this abstract is being provided to comply with the rule requiring an abstract that will allow examiners and other searchers to quickly ascertain the subject matter of the technical disclosure. It is submitted with the understanding that it will not be used to interpret or limit the scope or meaning of the claims, as promised by the Patent Office's rule.

The foregoing discussion should be understood as illustrative and should not be considered to be limiting in any sense. While the inventions have been particularly shown and described with references to preferred embodiments thereof, it will be understood by those skilled in the art that various changes in form and details may be made therein without departing from the spirit and scope of the inventions as defined by the claims.

The corresponding structures, materials, acts and equivalents of all means or step plus function elements in the claims below are intended to include any structure, material, or acts for performing the functions in combination with other claimed elements as specifically claimed.

Aspects of Inventions

The following aspects of inventions hereof are intended to be described herein, and this section is to ensure that they are mentioned. They are named aspects, and although they appear similar to claims, they are not claims. However, at some point in the future, the applicants reserve the right to claim any and all of these aspects in this and any related applications.

A1. A semi-conductor wafer comprising:
  a. a first surface; and
  b. a second surface;
  c. a first region with a first average thickness in a direction orthogonal to the first surface;
  d. a second region with a second average thickness that is thicker than the first average thickness and that is in a controlled location; and
  e. interstitial oxygen content of less than $6 \times 10^{17}$ atoms/cc;
  f. total oxygen content of less than $8.75 \times 10^{17}$ atoms/cc.

A2. A semi-conductor wafer comprising:
  a. a first surface; and
  b. a second surface;
  c. a first region with a first average thickness in a direction orthogonal to the first surface;
  d. a second region that is in a controlled location, with a second average thickness, the ratio of the second average thickness to the first average thickness being between 1.28 to 1 and 5 to 1.

A3. A semi-conductor wafer comprising:
  a. a first surface; and
  b. a second surface;
  c. a first region with a first average thickness of less than 160 microns in a direction orthogonal to the first surface;
  d. a second region in a controlled location, having a second average thickness of at least 180 microns.

A4. The semi-conductor wafer of aspects 1 or 3, the ratio of second average thickness to the first average thickness being between 1.28 to 1 and 5 to 1.

A5. The wafer of aspects 2-3, the wafer comprising an interstitial oxygen content of less than $6 \times 10^{17}$ atoms/cc and a total oxygen content of less than $8.75 \times 10^{17}$ atoms/cc.

A6. The wafer of any of aspects 1-2, the first average thickness being less than 140 microns and the second average thickness being at least 180 microns.

A7. The semi-conductor wafer of aspect 1, the second surface comprising a base level and, in the second region, a second-surface raised feature, extending from the second surface beyond the base level a distance of between 0.25 and four times the first average thickness.

A8. The wafer of any of the preceding aspects, the wafer comprising interstitial oxygen content of less than $2 \times 10^{17}$ atoms/cc.

A9. The wafer of any of the preceding aspects, the wafer comprising total oxygen content of less than $5.25 \times 10^{17}$ atoms/cc.

A10. The wafer of any of the preceding aspects, the first region having an average thickness of less than 150 microns.

A11. The wafer of any of the preceding aspects, the first region having an average thickness of less than one of:
  a. 120 microns,
  b. 80 microns, and
  c. 60 microns.

A12. The wafer of any of the preceding aspects, the second region being selected from the group consisting of at least one of: a perimeter; a border; an internal stripe; a landing; and an island.

A13. The wafer of any of the preceding aspects, the second region having a thickness of less than 250 microns, preferably between 180 and 250 microns and more preferably between 180 and 200 microns.

A14. The wafer of any of the preceding aspects, the second region comprising a stripe region, further comprising a metallization upon at least a portion of the stripe.

A15 The wafer of aspect 14, further comprising a bus-wire contacting the metallization.

A16. The wafer of any of the preceding aspects, the second region comprising a landing region.

A17. The wafer of aspect 16, the second region comprising at least one island.

A18. The wafer of aspect 17, further comprising a metallization coupling the landing region and the island region.

A19. The wafer of aspect 18, further comprising a bus-wire contacting the metallization at the landing and the island.

A20. The wafer of aspect 19, the bus-wire positioned to contact the metallization between the landing and the island.

A21 The wafer of aspect 19, the bus-wire being positioned to be spaced apart from the metallization at a region between the landing and the island.

A22. The wafer of aspect 16, the landing having a thickness that is greater adjacent the second region and lesser adjacent the first region.

A23. The wafer of aspect 22, the landing having a thickness that transitions gradually from the greater thickness to the lesser thickness.

A24. The wafer of any of the preceding aspects, further comprising a thickness transition region between the first region to the second region, the transition being chosen from the group consisting of: an abrupt transition and a gradual transition.

A25. The wafer of any of the preceding aspects, the second region comprising a perimeter region having a width and the wafer further comprising a thickness transitional region from the second region to the first region, which transitional region also has a width.

A26. The wafer of aspect 25, the perimeter region width being approximately equal to the transitional region width.

A27. The wafer of aspect 25, the perimeter region width being significantly greater than the transitional region width.

A28. The wafer of any of the preceding aspects, further comprising encapsulating material covering the second surface and the bus-wire and a second wafer coupled to the bus-wire.

A29. The wafer of any of the preceding aspects, the first surface comprising a substantially flat surface.

A30 The wafer of aspect 7, the first surface comprising a base level and a first-surface raised feature; the first-surface raised feature extending from the first surface a distance of less than the distance by which the second-surface raised feature extends from the second surface.

A31. The wafer of any of the preceding aspects, the semi-conductor comprising Silicon.

A32. The wafer of any of the preceding aspects, the wafer comprising a wafer comprising a photo-voltaic collector.

A33. The wafer of aspect 32, the wafer first surface having a first side of length at least 156 mm and an orthogonal side of at least 77 mm.

A34. A method for fabricating a semi-conductor wafer, the method comprising the steps of:
  a. providing a molten semi-conductor material, having a surface;
  b. providing a template, comprising a porous body comprising:
    i. a melt-ward surface;
    ii. a back surface;
    iii. a first template region having a first heat extraction propensity;
    iv. a second template region having a second heat extraction propensity, which is greater than the first heat extraction propensity;
  c. providing a differential pressure regime such that pressure at at least a portion of the melt-ward surface is less than pressure at the molten semi-conductor material surface; and
  d. contacting the template melt-ward surface to the surface of the molten semi-conductor material for at least a portion of a contact duration, during which the melt-ward surface and the molten semi-conductor material are in contact with each other, and the differential pressure regime is provided, such that a body of semi-conductor material, solidifies upon the melt-ward surface, which formed body comprises:
   i. a first, thinner body region, which has a first thinner body average thickness, the first thinner body region having formed adjacent the first template region; and
   ii. a second, thicker body region, which has a second thicker body average thickness, the second body region having formed adjacent the second template region, the second body average thickness being greater than the first body thickness.

A35. The method of aspect 34, further comprising the step of detaching the formed body of semi-conductor material from the template.

A36. The method of aspect 35, the step of detaching the formed body comprising reducing the degree of differential pressure regime.

A37. The method of aspect 35, the step of detaching the formed body comprising applying a detaching force mechanically to the formed body.

A38. The method of aspect 34, the first template region comprising an interior region, whereby the first, thinner body region is an interior region.

A39. The method of aspect 38, the second template region comprising a perimeter region, and the second, thicker body region comprising a perimeter region.

A40. The method of any of aspects 38 and 39, the second template region comprising a stripe region that extends across the interior region, and the second, thicker body region comprising a stripe region that extends across the body interior region.

A41. The method of any of aspects 38-40, the second template region comprising a landing region, the second, thicker body region comprising a landing.

A42. The method of any of aspects 38-41, the second template region comprising an island region, the second, thicker body region comprising an island.

A43. The method of aspect 38, the second template region comprising a perimeter region, and the second, thicker body region comprising a perimeter, the second thicker template region further comprising at least one selected from the group consisting of:
   a. a stripe region that extends across the interior region, whereby the second, thicker body region comprises a stripe that extends across the body interior;
   b. a landing region, whereby the second, thicker body region comprises a landing; and
   c. an island region, whereby the second, thicker body region comprises an island.

A44. The method of any of aspects 41-43, further comprising the step of providing on the formed body, metallization material that extends from a first island to at least one of a second island and a landing.

A45. The method of aspect 44, further comprising the step of providing a bus-wire that extends from the first island to the at least one of a second island and a landing, the bus wire contacting the metallization between the first island and the at least one of a second island and a landing.

A46. The method of aspect 44, further comprising the step of providing a bus-wire that extends from the first island to the at least one of a second island and a landing, the bus wire being spaced away from the metallization between the first island and the at least one of a second island and a landing.

A47. The method of any of aspects 41-43, the second region comprising a stripe region, further comprising the step of providing on the formed body, metallization material that extends along the stripe region.

A48. The method of aspect 47, further comprising the step of providing a bus-wire that extends along the metallization.

A49. The method of any of aspects 34-48, the porous template comprising template material having a first lesser average thickness at the first template region and template material having a second, greater average thickness at the second template region, whereby the greater heat extraction propensity of the second template region as compared to the first template region is due at least in part to the greater average thickness of the template material of the second template region as compared to the average thickness of the template material of the first template region.

A50. The method of any of aspects 34-49, the porous template having a functional material having a first thermal conductivity at the first template region and a functional material having a second, greater thermal conductivity at the second template region, whereby the greater heat extraction propensity of the second template region as compared to the first template region is due at least in part to the greater functional material thermal conductivity of the second template region as compared to the lesser functional material thermal conductivity of the first template region.

A51. The method of aspect 50, the functional materials comprising the same compositions as each other, the functional material of first region having a first thickness and the functional material of second region having a second thickness, which is lesser than the first thickness.

A52. The method of any of aspects 50-51, at least one functional material comprising a coating.

A53. The method of any of aspects 50-51, at least one functional material comprising at least one interposer layer.

A54. The method of aspect 53, the interposer layer comprising two stacked interposer layers of different size.

A55. The method of aspect 53, the interposer layer comprising a single interposer layer having different thicknesses at different locations.

A56. The method of any of aspects 34-53, the porous template comprising template material having a first gas permeability at the first template region and template material having a second, greater gas permeability at the second template region, whereby the greater heat extraction propensity of the template second region as compared to the first template region is due at least in part to the greater permeability of the template material of the second template region as compared to permeability of the template material of the first template region.

A57. The method of any of aspects 34-56, further comprising the step of coupling the first template region to a first source of differential pressure, and the step of coupling the second template region to a second source of differential pressure, the second source of differential pressure providing greater differential pressure than the first source of differential pressure, whereby the greater heat extraction propensity of the second template region as compared to the first template region is due at least in part to the greater differential pressure provided at the second template region as compared to the differential pressure provided at the first template region.

A58. The method of aspect 49, wherein the first lesser average thickness at the first template region is due to a plurality of holes that are provided in the first template region.

A59. The method of aspect 58, the holes comprising blind holes that extend partway from the porous body back surface to the porous body melt-ward surface.

A60. A template, comprising a porous body comprising:
a. a melt-ward surface;
b. a back surface;
c. a first region having a first heat extraction propensity; and
d. a second region having a second heat extraction propensity, which is greater than the first heat extraction propensity.

A61. The template of aspect 60, the porous body comprising material having a first, lesser average thickness at the first region and material having a second, greater average thickness at the second region, whereby the greater heat extraction propensity of the second region as compared to the lesser heat extraction propensity of the first region is due at least in part, to the greater thickness of the material of the second region as compared to the lesser thickness of the material of the first region.

A62. The template of aspect 62, the melt-ward surface comprising a relatively planar surface, as compared to the back surface, the second region of greater thickness being established by raised portions that extend from a base level of the back surface, away from the melt-ward surface.

A63. The template of any of aspects 60-62, the first region comprising spaced apart voids that extend from the back surface toward the melt-ward surface.

A64. The template of aspect 63, the voids having a center-to-center spacing on the order of or less than the average thickness of the template in the region in which they reside.

A65. The template of any of aspects 63-64, the voids having a diameter on the order of or less than the average thickness of the template in the region in which they reside.

A66. The template of any of aspects 63-65, the voids having a depth at least ½ the average thickness of the region of the template in which they reside.

A67. The template of any of aspects 63-66, the voids comprising blind holes.

A68. The template of aspect 67, the blind holes comprising empty holes.

A69. The template of any of aspects 60-68, the porous body comprising on its melt-ward surface, functional material having a first, greater thickness at the first region and functional material having a second, lesser thickness at the second region, whereby the greater heat extraction propensity of the second region as compared to the lesser heat extraction propensity of the first region is due at least in part to the lesser thickness of the functional material of the second region as compared to the greater thickness of the functional material of the first region.

A70. The template of any of aspects 60-68, the porous body comprising on its melt-ward surface, functional material having a first, lesser thermal conductivity at the first region and functional material having a second, greater thermal conductivity at the second region, whereby the greater heat extraction propensity of the second region as compared to the lesser heat extraction propensity of the first region is due at least in part to the greater thermal conductivity of the functional material of the second region as compared to the lesser thermal conductivity of the functional material of the first region.

A71. The template of any of aspects 69-70, the functional material comprising a coating.

A72. The template of aspect 71, the coating comprising a coating applied by a method selected from the group consisting of: curtain coating, spraying, slot die coating and meniscus coating.

A73 The template of aspect 69, the functional material comprising at least one free standing interposer layer.

A74. The template of aspect 73, the interposer layer comprising two stacked interposer layers of different surface area.

A75. The template of aspect 73, the interposer layer comprising a single interposer layer having different thicknesses at different locations.

A76. The template of any of aspects 60-75, the porous body comprising material having a first permeability at the first region and material having a second, greater permeability at the second region, whereby the greater heat extraction propensity of the second region as compared to the lesser heat extraction propensity of the first region is due at least in part to the greater permeability of the material of the second region as compared to permeability of the material of the first region.

A77. The template of any of aspects 60-76, the first region comprising an interior region.

A78. The template of any of aspects 60-77, the second region comprising a perimeter region.

A79. The template of any of aspects 77 and 78, the second region comprising a stripe region that extends across the interior region.

A80. The template of any of aspects 77-79, the second region comprising a landing region.

A81. The template of any of aspects 77-80, the second region comprising an island region.

A82. The template of aspect 77, the second region comprising a perimeter region, and at least one selected from the group consisting of:
a. a stripe region that extends across the interior region;
b. a landing region; and
c. an island region.

Having described the inventions disclosed herein, what is claimed is:

1. A semi-conductor wafer comprising:
a. a first surface; and
b. a second surface;
c. a first region with a first average thickness in a direction orthogonal to the first surface;
d. a second region with a second average thickness that is thicker than the first average thickness and that is in a selectable location; and
e. a third region with a third average thickness that is thicker than the first average thickness and that is thinner than the second average thickness.

2. The wafer of claim 1, the ratio of second average thickness to the first average thickness being between 1.28 to 1 and 5 to 1.

3. The wafer of claim 1, the wafer comprising an interstitial oxygen content of less than $6 \times 10^{17}$ atoms/cc and a total oxygen content of less than $8.75 \times 10^{17}$ atoms/cc.

4. The wafer of claim 1, the first average thickness being less than 160 microns and the second average thickness being at least 180 microns.

5. The wafer of claim 1, the second region being selected from the group consisting of at least one of: a perimeter; a border, an internal stripe; a landing; and an island.

6. The wafer of claim 1, the second region having a thickness of less than 250 microns, preferably between 180 and 250 microns and more preferably between 180 and 200 microns.

7. A method for fabricating a semi-conductor wafer, the method comprising the steps of:
a. providing a molten semi-conductor material, having a surface;

b. providing a template, comprising a porous body comprising:
   i. a melt-ward surface;
   ii. a back surface;
   iii. a first template region having a first heat extraction propensity;
   iv. a second template region having a second heat extraction propensity, which is greater than the first heat extraction propensity;
c. providing a differential pressure regime such that pressure at at least a portion of the melt-ward surface is less than pressure at the molten semi-conductor material surface; and
d. contacting the template melt-ward surface to the surface of the molten semi-conductor material for at least a portion of a contact duration, during which the melt-ward surface and the molten semi-conductor material are in contact with each other, and the differential pressure regime is provided, such that a body of semi-conductor material, solidifies upon the melt-ward surface, which formed body comprises:
   i. a first, thinner body region, which has a first thinner body average thickness, the first thinner body region having formed adjacent the first template region; and
   ii. a second, thicker body region, which has a second thicker body average thickness, the second body region having formed adjacent the second template region, the second body average thickness being greater than the first body thickness.

8. The method of claim 7, the first template region comprising an interior region, whereby the first, thinner body region is an interior region.

9. The method of claim 7, the second template region comprising a perimeter region, and the second, thicker body region comprising a perimeter region.

10. The method of claim 7, the second template region comprising a perimeter region, and the second, thicker body region comprising a perimeter, the second thicker template region further comprising at least one selected from the group consisting of:
   a. a stripe region that extends across the interior region, whereby the second, thicker body region comprises a stripe that extends across the body interior;
   b. a landing region, whereby the second, thicker body region comprises a landing; and
   c. an island region, whereby the second, thicker body region comprises an island.

11. The method of claim 7, the template porous body comprising template material having a first lesser average thickness at the first template region and template material having a second, greater average thickness at the second template region, whereby the greater heat extraction propensity of the second template region as compared to the first template region is due at least in part to the greater average thickness of the template material of the second template region as compared to the average thickness of the template material of the first template region.

12. The method of claim 7, the template porous body having a functional material having a first thermal conductivity at the first template region and a functional material having a second, greater thermal conductivity at the second template region, whereby the greater heat extraction propensity of the second template region as compared to the first template region is due at least in part to the greater functional material thermal conductivity of the second template region as compared to the lesser functional material thermal conductivity of the first template region.

13. The method of claim 12, the functional materials comprising the same compositions as each other, the functional material of the first region having a first thickness and the functional material of the second region having a second thickness, which is lesser than the first thickness.

14. The method of claim 7, the template porous body comprising template material having a first gas permeability at the first template region and template material having a second, greater gas permeability at the second template region, whereby the greater heat extraction propensity of the template second region as compared to the first template region is due at least in part to the greater permeability of the template material of the second template region as compared to permeability of the template material of the first template region.

15. The method of claim 7, further comprising the step of coupling the first template region to a first source of differential pressure, and the step of coupling the second template region to a second source of differential pressure, the second source of differential pressure providing greater differential pressure than the first source of differential pressure, whereby the greater heat extraction propensity of the second template region as compared to the first template region is due at least in part to the greater differential pressure provided at the second template region as compared to the differential pressure provided at the first template region.

16. A template, comprising a porous body comprising:
   a. a melt-ward surface;
   b. a back surface;
   c. a first region having a first heat extraction propensity; and
   d. a second region having a second heat extraction propensity, which is greater than the first heat extraction propensity.

17. The template of claim 16, the porous body comprising material having a first, lesser average thickness at the first region and material having a second, greater average thickness at the second region, whereby the greater heat extraction propensity of the second region as compared to the lesser heat extraction propensity of the first region is due at least in part, to the greater thickness of the material of the second region as compared to the lesser thickness of the material of the first region.

18. The template of claim 16, the porous body comprising on its melt-ward surface, functional material having a first, greater thickness at the first region and functional material having a second, lesser thickness at the second region, whereby the greater heat extraction propensity of the second region as compared to the lesser heat extraction propensity of the first region is due at least in part to the lesser thickness of the functional material of the second region as compared to the greater thickness of the functional material of the first region.

19. The template of claim 16, the porous body comprising on its melt-ward surface, functional material having a first, lesser thermal conductivity at the first region and functional material having a second, greater thermal conductivity at the second region, whereby the greater heat extraction propensity of the second region as compared to the lesser heat extraction propensity of the first region is due at least in part to the greater thermal conductivity of the functional material of the second region as compared to the lesser thermal conductivity of the functional material of the first region.

20. The template of claim 16, the first region comprising an interior region.

21. The template of claim 20, the second region comprising a perimeter region, and at least one selected from the group consisting of:
  a. a stripe region that extends across the interior region;
  b. a landing region; and
  c. an island region.

\* \* \* \* \*